US008236633B2

(12) United States Patent
Sekiguchi et al.

(10) Patent No.: US 8,236,633 B2
(45) Date of Patent: Aug. 7, 2012

(54) SEMICONDUCTOR DEVICE AND METHOD FOR MANUFACTURING THE SAME

(75) Inventors: Keiichi Sekiguchi, Kanagawa (JP); Junichi Koezuka, Kanagawa (JP); Yasuyuki Arai, Kanagawa (JP); Shunpei Yamazaki, Tokyo (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 12/059,652

(22) Filed: Mar. 31, 2008

(65) Prior Publication Data

US 2008/0188050 A1 Aug. 7, 2008

Related U.S. Application Data

(62) Division of application No. 10/890,234, filed on Jul. 14, 2004, now Pat. No. 7,365,361.

(30) Foreign Application Priority Data

Jul. 23, 2003 (JP) ................................ 2003-277966
Jul. 23, 2003 (JP) ................................ 2003-277997

(51) Int. Cl.
*H01L 21/84* (2006.01)

(52) U.S. Cl. ................ 438/154; 257/E21.561; 438/164; 438/302

(58) Field of Classification Search .......... 438/151–166, 438/302; 257/E21.561
See application file for complete search history.

(56) References Cited

U.S. PATENT DOCUMENTS 5,261,156 A 11/1993 Mase et al.
5,358,879 A * 10/1994 Brady et al. .................. 438/163
5,547,883 A * 8/1996 Kim ............................. 438/158
5,763,899 A 6/1998 Yamazaki et al.
5,767,930 A * 6/1998 Kobayashi et al. ............. 349/42
5,851,861 A 12/1998 Suzawa et al.
6,146,930 A 11/2000 Kobayashi et al.
6,284,577 B1 9/2001 Suzawa et al.
6,362,866 B1 3/2002 Yamazaki et al.
6,468,843 B2 10/2002 Suzawa et al.
6,661,096 B1 12/2003 Takayama et al.
6,773,971 B1 * 8/2004 Zhang et al. .................. 438/163
2002/0025613 A1 2/2002 Suzawa et al.
2002/0041355 A1 * 4/2002 Yamazaki et al. ............ 349/149
2002/0121654 A1 9/2002 Yamamoto

FOREIGN PATENT DOCUMENTS

JP 10-154814 6/1988
JP 5-166745 7/1993
JP 7-14880 1/1995
JP 08-037313 2/1996
JP 8-153875 6/1996
JP 11-160734 6/1999

* cited by examiner

*Primary Examiner* — Richard A. Booth

(74) *Attorney, Agent, or Firm* — Nixon Peabody LLP; Jeffrey L. Costellia

(57) ABSTRACT

The present invention provides a method for manufacturing a semiconductor device, by which a transistor including an active layer, a gate insulating film in contact with the active layer, and a gate electrode overlapping the active layer with the gate insulating film therebetween is provided; an impurity is added to a part of a first region overlapped with the gate electrode with the gate insulating film therebetween in the active layer and a second region but the first region in the active layer by adding the impurity to the active layer from one oblique direction; and the second region is situated in the one direction relative to the first region.

12 Claims, 20 Drawing Sheets

500
501
502

503
504
505
A
A'
B
B'
600

506

507

604
536
605
533
534
535
A
A'
B
B'
530
509
531
532
537
538
539

FIG. 17D ENERGY DENSITY DISTRIBUTION BETWEEN A-A'

SEMICONDUCTOR DEVICE AND METHOD FOR MANUFACTURING THE SAME

BACKGROUND OF THE INVENTION

1. Field of the Invention

The present invention relates to a method for manufacturing a transistor, specifically a thin film transistor, having an LDD region, and further relates to a semiconductor device using the manufacturing method.

2. Related Art

A semiconductor display device formed by using an inexpensive glass substrate cannot easily be miniaturized since a peripheral area (frame area) of a pixel portion required for mounting occupies more area in a substrate as resolution becomes higher. Thus, it is considered that there is a limitation on a method for mounting an integrated circuit formed by using a single crystalline silicon wafer on a glass substrate. Therefore, a technique for integrally forming an integrated circuit including a driver circuit over a glass substrate provided with a pixel portion, that is referred to as System On Panel, is now focused on.

However, an integrated circuit formed over a glass substrate has lower degree of integration than that of an integrated circuit formed over a single crystalline silicon wafer. Therefore, it is an important object to miniaturize a semiconductor element on practical application. According to miniaturization of a semiconductor element, an integrated circuit formed over a glass substrate can highly be integrated, thereby promoting miniaturization, weight reduction, further, low power consumption, and speedup of a semiconductor display device. In addition, according to miniaturization of a semiconductor element as well as an integrated circuit, high definition can be realized also in a pixel portion.

A semiconductor display device provided with a thin film transistor (TFT) using an amorphous semiconductor film in a pixel portion has the advantage of having high productivity and low cost. However, the TFT using an amorphous semiconductor film has the disadvantage of having low mobility. Therefore, it is considered that a thin film transistor using an amorphous semiconductor film is unsuitable for a driver circuit that required high-speed operation such as a scanning line driver circuit for selecting a pixel or a signal line driver circuit for supplying a video signal to the selected pixel. Thus, a mode of manufacturing an IC chip in which a driver circuit is included by using a single crystalline silicon wafer and of mounting the IC chip on the periphery of a pixel portion by TAB (Tape Automated bonding) or COG (Chip on Glass) is generally adopted.

However, a unit cost of a silicon wafer is higher than that of a glass substrate, and a silicon wafer is not suitable for providing an inexpensive IC chip. The advantage of a low cost that is a characteristic of a semiconductor display device using an amorphous semiconductor film cannot fully be utilized. The sizes of silicon wafers that are comparatively a lot on the market are approximately not more than 12 inches in diameter. Although more than 12 inches sized silicon wafers are also on the market, a cost per unit area further increases as its size increases. Consequently, costs have to be sacrificed in order to increase throughput by increasing the number of IC chips obtained from one substrate.

Thus, a technique of forming a driver circuit over a glass substrate, dividing into strips, and mounting on a substrate over which a pixel portion is formed is disclosed in the following references (Reference 1: Japanese Patent Application Laid-Open No. 7-014880, and Reference 2: Japanese Patent Application Laid-Open No. 11-160734).

As disclosed in References 1 and 2, an incidence rate of a defect in a contact portion of a terminal, caused by a difference of a thermal expansion coefficient can be decreased by using a substrate made of the same material as a substrate over which a pixel portion is formed (hereinafter, referred to as an element substrate), forming a driver circuit, and mounting on the element substrate. Accordingly, a yield can be increased. In addition, a cost of a semiconductor display device as a whole can be reduced by forming a driver circuit over a glass substrate.

Meanwhile, a semiconductor display device cannot easily be miniaturized since a peripheral area (frame area) of a pixel portion required for mounting occupies more area in a substrate as resolution of a pixel portion becomes higher. Therefore, an IC chip mounted on a substrate over which a pixel portion is formed is preferably smaller. However, an integrated circuit formed over a glass substrate has lower degree of integration than that of an integrated circuit formed over a single crystalline silicon wafer. Therefore, on promoting miniaturization of a semiconductor display device and high integration of an integrated circuit, it is an important object to miniaturize a semiconductor element formed over a glass substrate. When an integrated circuit formed over a glass substrate can highly be integrated according to miniaturization of a semiconductor element, miniaturization, weight reduction, further, low power consumption, and speedup of a semiconductor display device can be advanced.

However, miniaturization of a TFT that is one of semiconductor elements involves a problem of decline in reliability due to a hot carrier effect. Therefore, an LDD (Lightly Doped Drain) structure is adopted as a means of controlling a hot carrier effect. The LDD structure is a structure in which an LDD region having a lower impurity concentration than that of a source/drain region is provided between the source/drain region and a channel formation region. Particularly, it is known that in the case of having a structure in which an LDD region is overlapped with a gate electrode with a gate insulating film therebetween (GOLD structure, Gate Overlapped Lightly Doped Drain structure), a hot carrier effect can efficiently be prevented by relaxation of a high electric field in the vicinity of a drain and reliability can be improved. In this specification, a region in which an LDD region is overlapped with a gate electrode with a gate insulating film therebetween is referred to as an Lov region and a region in which an LDD region is not overlapped with a gate electrode is referred to as an Loff region.

It is disclosed in the following reference that deterioration of a transistor can be prevented by employing a GOLD structure (Reference 3: Japanese Patent Application Laid-Open No. 8-153875).

A TFT having an Loff region tends to be able to reduce more off current than a TFT having an Lov region. Therefore, a TFT having an Loff region is suitably used for a switching element of a pixel in which reduction of an off current is regarded as more important than high-speed drive. Meanwhile, a TFT having an Lov region can be driven at higher speed than a TFT having an Loff region. Specifically, switching can be performed at higher speed. A TFT having an Lov region is suitably used for a driver circuit since operating frequency is higher than that of a pixel portion and high-speed drive is regarded as more important than reduction of an off current. It is preferable that a TFT having an Loff region and a TFT having an Lov region are appropriately used according to characteristics required for a circuit element.

Several methods have been proposed for manufacturing a TFT having an Lov region, and one of them is to obliquely implant ions using a gate electrode as a mask. According to the above method, a dopant (impurity) can be added by an ion implantation method to a region overlapped with a gate electrode with a gate insulating film therebetween, without using a resist mask and with the number of steps reduced.

However, in order to form an Lov region on both a source region side and a drain region side, it is necessary to perform ion implantation twice from a different implantation direction. This can be a factor of preventing a throughput in a step of ion implantation from improving. In addition, there is a method (tilt rotation) for obliquely and uniformly implanting ions by rotating a substrate; however, according to this method, rotation of a substrate need to precisely be controlled and a large-scale apparatus for performing ion implantation is required. Particularly, the method is not suitable for a large substrate, and becomes a factor in preventing throughput from improving.

In addition, according to the above method, there is a problem that a TFT having an Lov region and a TFT having an Loff region cannot separately be formed over one substrate. According to the above method, a TFT having an Lov region and a TFT having an Loff region cannot separately be formed over one substrate in the case of integrating a pixel portion and a driver circuit by System On Panel. In addition, such a TFT without an LDD region that a source region and a drain region are in contact with a channel formation region and a TFT having an Lov region cannot separately be formed over one substrate.

A TFT having an Lov region and a TFT having an Loff region can separately be formed over one substrate by separately implanting a dopant using a resist mask. However, the number of resist masks and steps cannot be reduced, which becomes a factor of increasing a manufacturing cost. When a transistor having an offset gate structure, a transistor in which a source region and a drain region are in contact with a channel formation region, and the like as well as a TFT having an Loff region are intended to separately be formed over one substrate, the number of resist masks and steps cannot be reduced, which becomes a factor of increasing a manufacturing cost.

SUMMARY OF THE INVENTION

In view of the above problems, the present invention relates to a method for manufacturing a semiconductor device in which a transistor having an Lov region can separately be formed over a substrate provided with a transistor having an Loff region, a transistor having an offset gate structure, and a transistor in which a source region and a drain region are in contact with a channel formation region without providing a resist mask for forming an Lov region and throughput in a step of ion implantation can be improved. Further, the present invention relates to a semiconductor device that can reduce a cost per panel. Furthermore, the present invention relates to a semiconductor device which can reduce a cost per panel, using a chip in which an integrated circuit is formed of a thin semiconductor film (hereinafter, referred to as a thin film chip).

The inventors of the present invention think that it is better to change a position of an Lov region provided in an active layer of a transistor according to a dopant implantation direction than according to change the dopant implantation direction to a position of an Lov region. In other words, ion implantation is regarded as a fixed implantation in which an implantation direction is set to one direction, and a positional relationship among an Lov region, a channel formation region, and a gate electrode functioning as a mask in ion implantation is determined according to the implantation direction. Note that an implantation direction in this specification means a direction that a dopant is implanted from an ion source.

Specifically, an implantation direction is set to such one direction that a dopant obliquely intersects with a surface of an active layer, and an edge portion of a gate electrode overlapping an active layer is directed to the implantation direction side. Namely, a gate electrode and an active layer are disposed so that an exposed region of the active layer but a region overlapped with the gate electrode is situated closer to an implantation direction side than the region overlapped with the gate electrode. According to the above structure, an Lov region can be formed on both a source region side and a drain region side by ion implantation from one implantation direction. Therefore, in all transistors having the same conductivity and having an Lov region, the Lov region is disposed closer to a dopant implantation direction side than a channel formation region.

In the case of performing ion implantation to form an Lov region, in a transistor having an Loff region, a positional relationship among an active layer, a gate electrode, and an Loff region is determined according to an implantation direction so that an impurity is added only to a region serving as a source region and a drain region. Specifically, a region serving as an Loff region and a channel formation region is covered with a resist mask, and a region overlapped with the resist mask and an exposed region of the active layer but the region are disposed to be in contact with each other along the implantation direction. In other words, an edge portion of the resist mask overlapping the active layer is disposed to be in contact with each other along the implantation direction. According to the above structure, a transistor having an Lov region and a transistor having an Loff region can separately be formed over one substrate.

In the case of performing ion implantation to form an Lov region, in a transistor without an LDD region, in which a source region and a drain region are in contact with a channel formation region, a positional relationship among an active layer, a gate electrode, and an LDD region is determined according to an implantation direction so that an impurity is added only to a region serving as a source region and a drain region. Specifically, a region overlapped with the gate electrode and an exposed region of the active layer but the region are disposed to be in contact with each other along the implantation direction. In other words, an edge portion of the gate electrode overlapping the active layer is disposed to be along the implantation direction. According to the above structure, a transistor having an Lov region and a transistor in which a source region and a drain region are in contact with a channel formation region can separately be formed over one substrate.

In the case of performing ion implantation to form an Lov region, in a transistor having an offset region, a positional relationship among an active layer, a gate electrode, and an offset region is determined according to an implantation direction so that an impurity is added only to a region serving as a source region and a drain region and the offset region is formed. Specifically, the gate electrode and the active layer are disposed so that an exposed region of the active layer is disposed on an opposite side from an implantation direction with respect to the gate electrode. In other words, an edge portion of the gate electrode overlapping the active layer is disposed on an opposite side of the implantation direction. According to the above structure, a transistor having an Lov region and a transistor having an offset region can separately be formed over one substrate.

In addition to the above structure, a continuous wave laser may be used for crystallization of a semiconductor film. A semiconductor film crystallized by using only a pulsed laser beam is formed of a cluster of a plurality of crystal grains, in which the position and the size thereof are at random. Compared to the inside of crystal grains, thousands of recombination centers or trapping centers due to an amorphous structure or a crystal defect exist at the interfaces of crystal grains (crystal grain boundary). There is a problem that the potential of a crystal grain boundary is increased when carriers are trapped in the trapping centers, and is resulted in a barrier against carriers, so that the current transporting characteristics of carriers decrease. On the other hand, in the case of a continuous wave laser beam, a cluster of crystal grains made of single crystals elongating along a scanning direction can be formed by irradiating a semiconductor film while scanning the semiconductor film with an irradiation region (beam spot) of a laser beam in one direction to continuously grow crystals in the scanning direction. Therefore, mobility of a TFT used for a thin film chip can be improved by crystallizing a semiconductor film using a continuous wave laser.

A semiconductor device included in the category of the present invention includes all kinds of semiconductor devices using a transistor, such as a microprocessor, an image processing circuit, and a semiconductor display device. In addition, a thin film chip itself is included in the category of the semiconductor device of the present invention. The semiconductor display device includes a liquid crystal display device, a light emitting device having a light emitting element in each pixel, typified by an organic light-emitting element (OLED), a DMD (Digital Micromirror Device), a PDP (Plasma Display Panel), an FED (Field Emission Display), and other display devices having a circuit element using a semiconductor film in a driver circuit in its category.

A transistor in which an Lov region can be formed by using a manufacturing method of the present invention is not limited to a TFT using polycrystalline silicon, microcrystalline silicon (semi-amorphous silicon (SAS)), or amorphous silicon. The transistor may be a transistor formed by using single crystalline silicon, and it may be a transistor using SOI. Alternatively, it may be a transistor using an organic semiconductor, and it may be a transistor using a carbon nanotube. In addition, a transistor used for a semiconductor device of the present invention may have a single gate structure, a double gate structure, or a multi gate structure having three or more gate electrodes.

According to the above structures of the present invention, a transistor having an Lov region can separately be formed over a substrate provided with a transistor having an Loff region, a transistor in which a source region and a drain region are in contact with a channel formation region, a transistor having an offset region, and the like without providing a resist mask for forming an Lov region. Consequently, the number of resist masks and steps can be reduced, and a manufacturing cost can be reduced. In addition, throughput in a step of ion implantation can be improved.

In the present invention, a semiconductor device may be formed by mounting an integrated circuit using the above manufacturing method as a thin film chip on a substrate provided with a pixel portion or other integrated circuits. In addition to the above manufacturing method, the present invention includes the above thin film chip using the above manufacturing method and a semiconductor device on which the thin film chip is mounted in its category. Since a cost per chip of a thin film chip of the present invention can be reduced, a cost of a semiconductor device itself having the thin film chip can also be reduced.

These and other objects, features and advantages of the present invention will become more apparent upon reading of the following detailed description along with the accompanied drawings.

BRIEF DESCRIPTION OF THE DRAWINGS

In the accompanying drawings:

FIGS. 17A to 17D show distribution of energy density of a beam spot;

DETAILED DESCRIPTION OF THE INVENTION

Hereinafter, preferred embodiment modes of the present invention will be described with reference to the attached drawings. However, the present invention is implemented in many other modes. As is easily known to a person skilled in the art, the mode and the detail of the invention can be variously changed without departing from the purpose and the range of the present invention. Thus, the present invention is not interpreted while limiting to the following description of the embodiment mode.

Figure 1A:
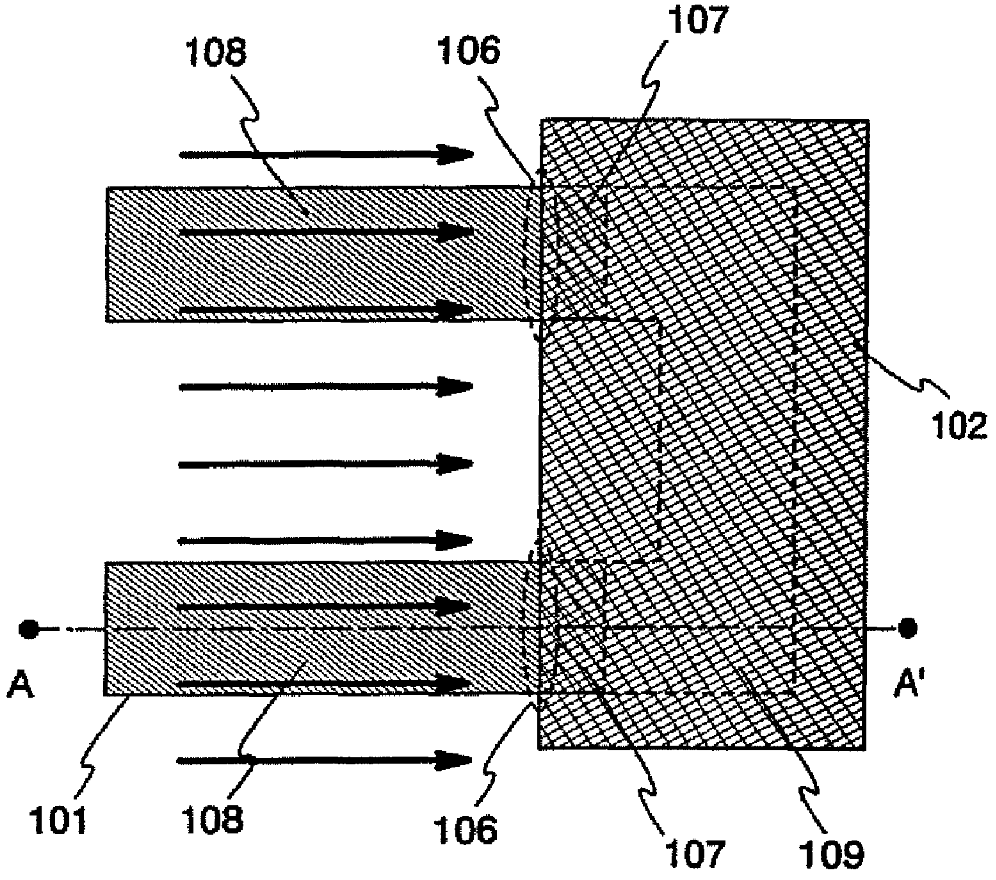
FIGS. 1A and 1B show a method for manufacturing a TFT having an Lov region.
Figure 1B:
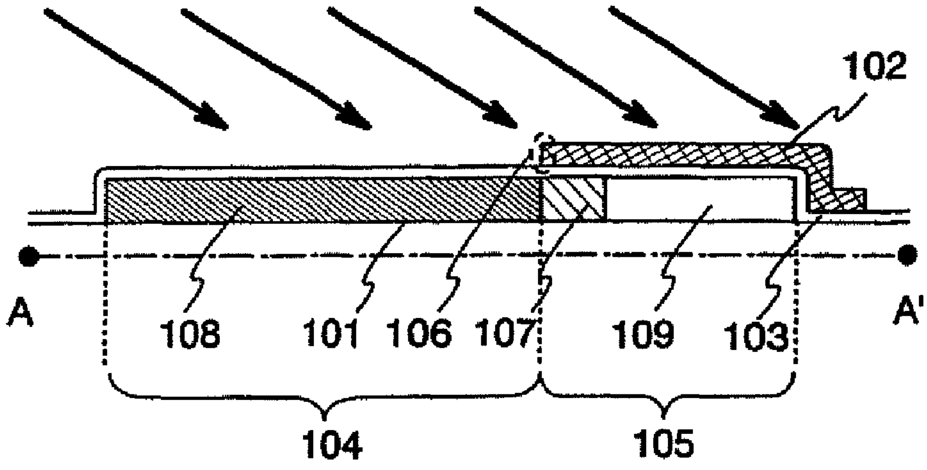

A method for manufacturing a semiconductor device of the present invention is described. FIG. 1A shows a top view of an active layer 101 and a gate electrode 102 functioning as a mask, at the time of performing ion implantation to form an Lov region. In addition, a cross-sectional view taken along a line A-A' in FIG. 1A is shown in FIG. 1B.

Arrow show an implantation direction at the time of ion implantation and obliquely intersect with a surface of the active layer 101. The active layer 101 and the gate electrode 102 overlap each other with a gate insulating film 103 therebetween. An exposed region 104 without being overlapped with the gate electrode 102 is disposed closer to a dopant implantation direction side than a region 105 of the active layer 101 that is overlapped with the gate electrode 102. Namely, an edge portion 106 of the gate electrode 102 overlapping the active layer 101, which is surrounded by a broken line, is directed to the implantation direction side.

According to the above structure, a dopant is implanted in a part of the region 105 of the active layer 101 that is overlapped with the gate electrode 102 to form an Lov region 107 at the time of ion implantation. In addition, source/drain regions 108, and a channel formation region 109 can separately be formed by the ion implantation. In FIGS. 1A and 1B, the two Lov regions 107 are formed to sandwich the channel formation region 109, and the source/drain regions 108 are formed to sandwich the channel formation region 109 and the two Lov regions 107.

In the case of forming an Lov region only on either the source region side or the drain region side, only one edge portion of the gate electrode overlapping the active layer may be directed to the implantation direction. Alternatively, the edge portion of the gate electrode overlapping the active layer is directed to the implantation direction on only one side. On the other side, the region overlapped with the gate electrode and the exposed region of the active layer are made to be in contact with each other along the implantation direction.

Figure 2A:
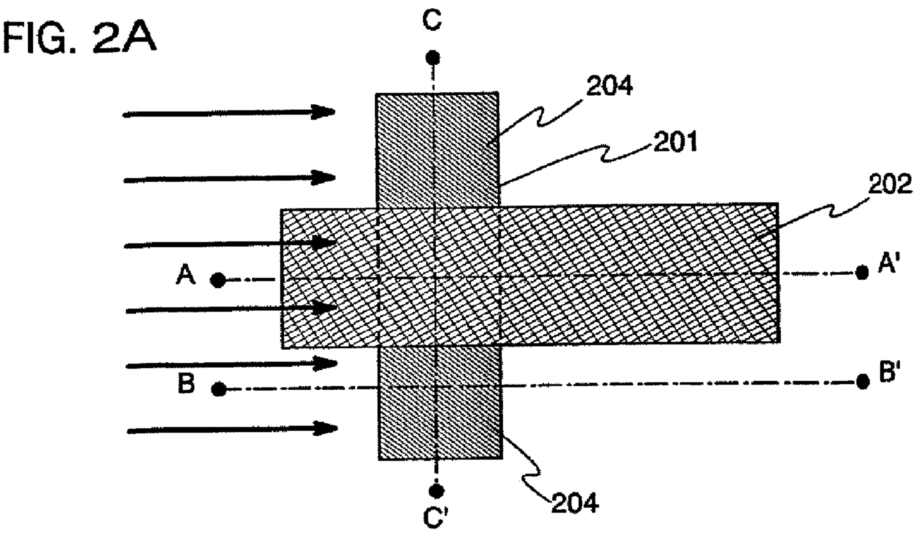
FIGS. 2A to 2D show a method for manufacturing a TFT in which a source region and a drain region are in contact with a channel formation region.
Figure 2B:
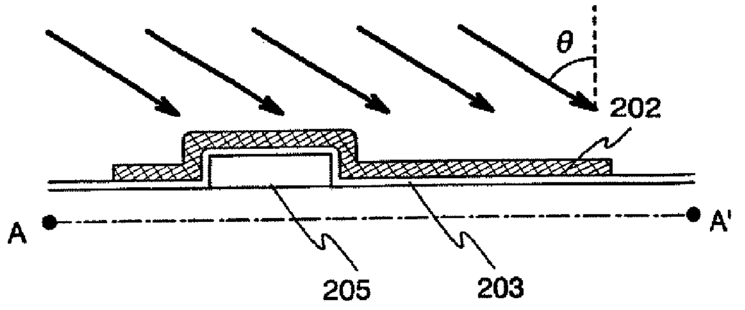
Figure 2C:
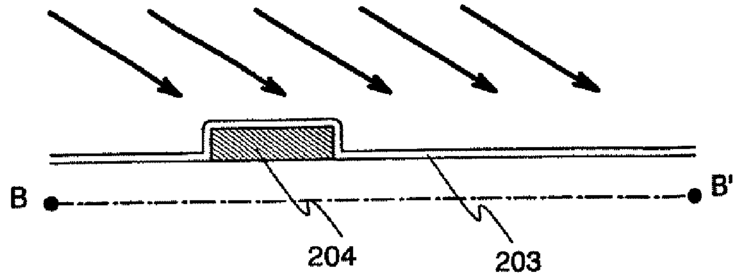
Figure 2D:
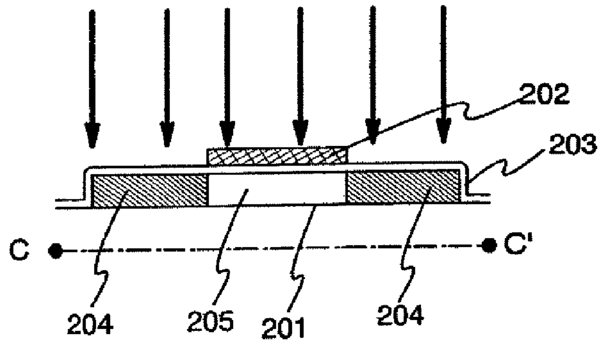

Subsequently, the case of manufacturing a TFT without an Lov region by obliquely performing ion implantation is described. FIG. 2A shows a top view of an active layer 201 and a gate electrode 202 functioning as a mask, at the time of obliquely performing ion implantation. A cross-sectional view taken along a line A-A' in FIG. 2A is shown in FIG. 2B. A cross-sectional view taken along a line B-B' in FIG. 2A is shown in FIG. 2C. A cross-sectional view taken along a line C-C' in FIG. 2A is shown in FIG. 2D.

Arrows show an implantation direction at the time of ion implantation and obliquely intersect with a surface of the active layer 201. The active layer 201 and the gate electrode 202 overlap each other with a gate insulating film 203 therebetween. In FIGS. 2A to 2D, an exposed region 204 without being overlapped with the gate electrode 202 and a region 205 of the active layer 201 that is overlapped with the gate electrode 202 are disposed to be in contact with each other along a dopant implantation direction.

According to the above structure, a dopant can be implanted only in the exposed region 204 without being overlapped with the gate electrode 202, and a source/drain region can be formed in the region 204 at the time of ion implantation. In addition, a channel formation region can be formed in the region 205 of the active layer 201 that is overlapped with the gate electrode 202 by the ion implantation.

Figure 6A:
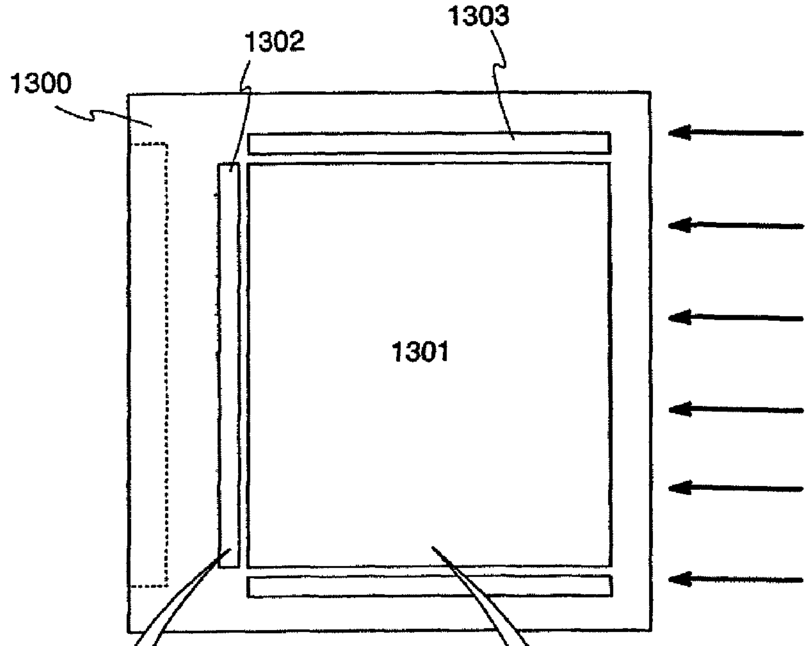
FIGS. 6A to 6E show layouts of each transistor in a panel in which a TFT having an Loff region and a TFT having an Lov region are formed.
Figure 6B:
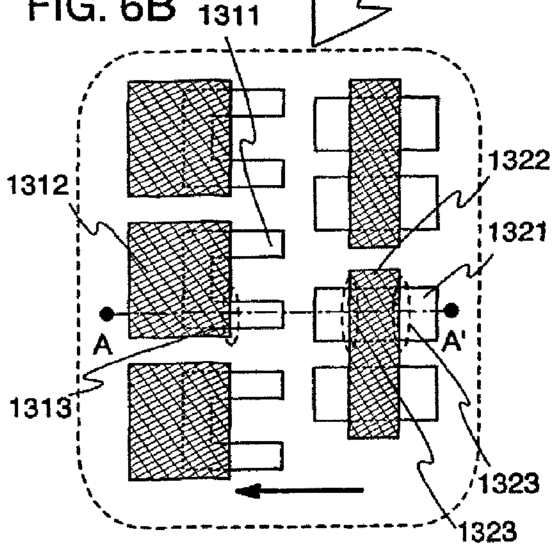

Subsequently, a layout of each transistor in the case of forming a TFT having an Loff region and a TFT having an Lov region over one substrate is described. FIG. 6A shows a top view of a pixel portion 1301, and a signal line driver circuit 1302 and a scanning line driver circuit included in a driver circuit, which are formed over one substrate 1300. In FIG. 6A, arrows show the dopant implantation direction. A part of the signal line driver circuit 1302 shown in FIG. 6A is enlarged and is shown in FIG. 6B. Further, a part of the pixel portion 1301 shown in FIG. 6A is enlarged and is shown in FIG. 6C.

In a TFT having an Lov region that is used for the signal line driver circuit 1302, an edge portion 1313 of a gate electrode 1312 overlapping an active layer 1311 is directed to the implantation direction side as shown in FIG. 6B. In the case of forming an Lov region only on either a source region side or a drain region side, only one edge portion 1323 of a gate electrode 1322 overlapping an active layer 1321 may be directed to the implantation direction. Alternatively, only on one side of the source region side or the drain region side, the edge portion of the gate electrode overlapping the active layer is directed to the implantation direction. On the other side, a region that is overlapped with the gate electrode and an exposed region of the active layer are made to be in contact with other along the implantation direction.

Figure 6C:
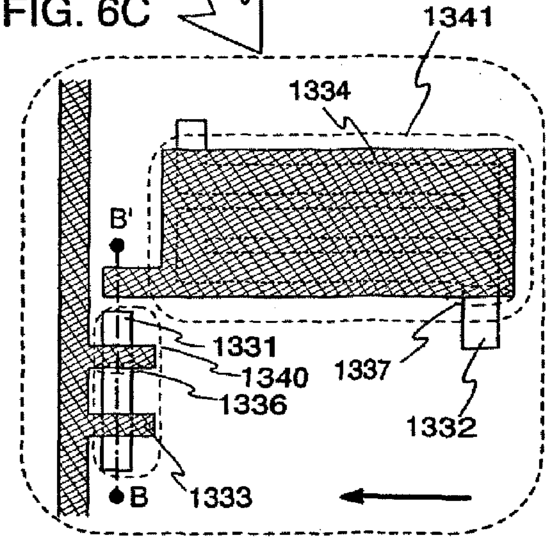
Figure 6D:
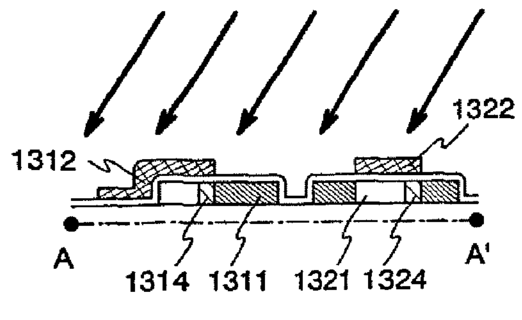

FIG. 6D shows a cross-sectional view taken along a line A-A' in FIG. 6B after ion implantation. As shown in FIG. 6D, an Lov region 1314 and an Lov region 1324 can be formed in the active layer 1311 and the active layer 1321 respectively by ion implantation from an oblique implantation direction.

As shown in FIG. 6C, a TFT 1340 without an Lov region which is used for the pixel portion 1301 is disposed so that a region of an active layer 1331 that is overlapped with a gate electrode 1333 and an exposed region of the active layer 1331 are in contact with each other along the implantation direction. In other words, an edge portion 1336 of the gate electrode 1333 overlapping the active layer 1331 is along the implantation direction. Similarly, a TFT 1341 without an Lov region is disposed so that a region of an active layer 1332 that is overlapped with a gate electrode 1334 and the exposed region of the active layer 1332 are in contact with each other along an implantation direction. In other words, an edge portion 1337 of the gate electrode 1334 overlapping the active layer 1332 is along the implantation direction.

Figure 6E:
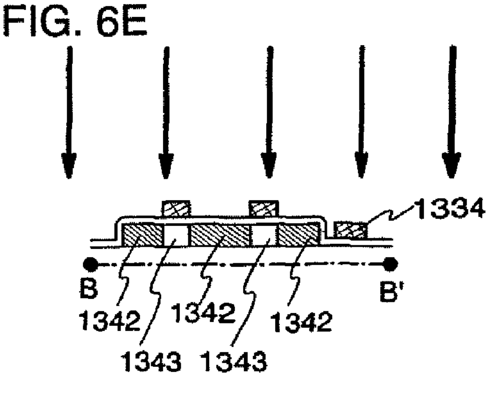

FIG. 6E shows a cross-sectional view taken along a line B-B' in FIG. 6C after ion implantation. As shown in FIG. 6E, only a channel formation region 1343, source/drain regions 1342 can be formed in the active layer 1331 by performing ion implantation from an oblique implantation direction. In addition, only a channel formation region, source/drain regions can be formed also in the active layer 1332, though not shown.

Thus, as for a semiconductor device manufactured by using a manufacturing method of the present invention, all positions of Lov regions with respect to channel formation regions are uniform on the implantation direction side, as long as the TFTs have the same conductivity. In other words, each direction from the Lov region to the channel formation region in the plurality of TFTs is consistent with each other. In TFTs in which a source region and a drain region are in contact with a channel formation region, a channel formation region and a source/drain region are in contact with each other along the implantation direction, as long as the TFTs have the same conductivity. In TFTs having Loff regions, channel formation regions and the Loff regions are in contact with each other along the implantation direction, as long as the TFTs have the same conductivity. In TFTs having offset regions, positions of the offset regions with respect to channel formation regions is uniform on an opposite side of the implantation direction side, as long as the TFTs have the same conductivity.

With reference to FIGS. 6A to 6E, an example of forming a TFT in which a source region and a drain region are in contact with a channel formation region over a substrate provided with a TFT having an Lov region is described. However, the present invention is not limited to this structure. In the case of forming a TFT having an Loff region and a TFT having an Lov region over one substrate, an edge portion of a resist mask overlapping an active layer may be directed to be along an implantation direction in a TFT in which an Loff region is formed.

According to the above structure of the present invention, a TFT having an Lov region can separately be formed over a substrate provided with a TFT having an Loff region, a TFT in which source/drain regions are in contact with a channel formation region, and the like without providing a resist mask for forming an Lov region. Consequently, the number of resist masks and steps can be reduced, and a manufacturing cost can also be reduced. In addition, throughput in a step of ion implantation can be improved.

Subsequently, a layout of a TFT having an Lov region in a semiconductor device of the present invention is described.

Figure 8A:
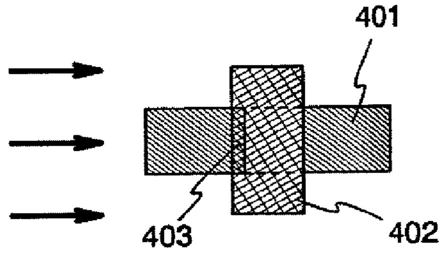
FIGS. 8A to 8D are top views of a TFT having an Lov region.

FIG. 8A shows a top view of a TFT having an Lov region. Reference numeral 401 denotes an active layer; 402, a gate electrode; and 403, an Lov region. Arrows correspond to a dopant implantation direction at the time of forming the Lov region 403. In addition, the Lov region 403 is provided only on either side of a source region or a drain region and is directed to a dopant implantation direction side.

Figure 8B:
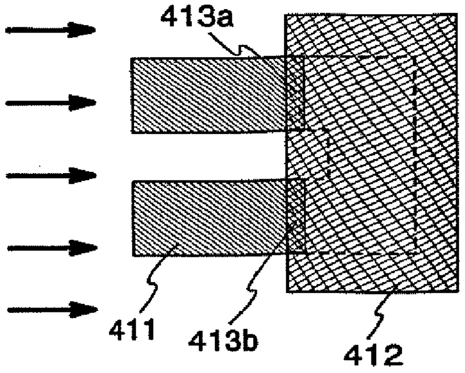
Figure 8C:
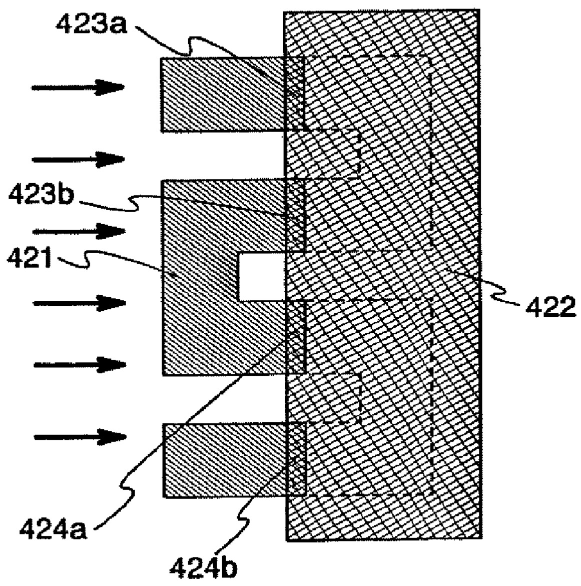

FIG. 8B shows a top view of another TFT having an Lov region. Reference numeral 411 denotes an active layer; 412, a gate electrode; and 413*a* and 413*b*, Lov regions. Arrows correspond to a dopant implantation direction at the time of forming the Lov regions 413*a* and 413*b*. In FIG. 8B, the Lov regions 413*a* and 413*b* are directed to a dopant implantation direction side.

FIG. 5C shows a top view of another TFT having an Lov region. Reference numeral 421 denotes an active layer; 422, a gate electrode; and 423*a*, 423*b*, 424*a*, and 424*b*, Lov regions. Arrows correspond to a dopant implantation direction at the time of forming the Lov regions 423*a*, 423*b*, 424*a*, and 424*b*. In FIG. 5C, the Lov regions 423*a*, 423*b*, 424*a*, and 424*b* are directed to a dopant implantation direction side.

Figure 8D:
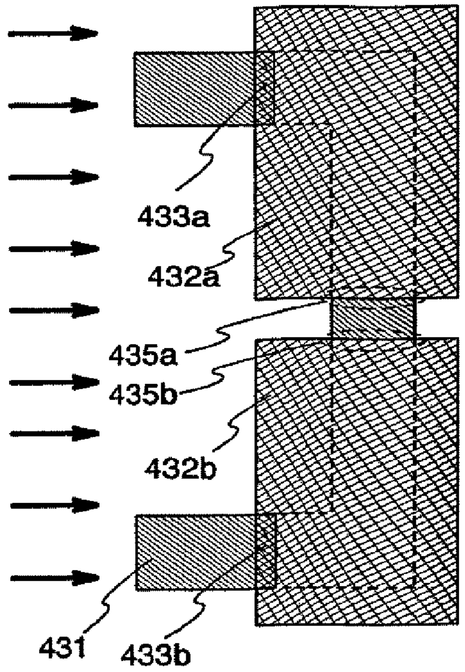

FIG. 8D shows a top view of another TFT having an Lov region. Reference numeral 431 denotes an active layer; 432*a* and 432*b*, gate electrodes; and 433*a* and 433*b*, Lov regions. Arrows correspond to a dopant implantation direction at the time of forming the Lov regions 433*a* and 433*b*. In FIG. 8D, the Lov regions 433*a* and 433*b* are directed to a dopant implantation direction side. The Lov region 433*a* is overlapped with the gate electrode 432*a*, and the Lov region 433*b* is overlapped with the gate electrode 432*b*. An edge portion 435*a* of the gate electrode 432*a* overlapping the active layer 431 is along the implantation direction. Further, an edge portion 435*b* of the gate electrode 432*b* overlapping the active layer 431 is along the implantation direction.

As shown in FIGS. 8A to 8D, TFTs having various structures can be manufactured according to the present invention. The layouts of TFTs shown in the figures are merely examples, and the present invention is not limited to the structures shown in FIGS. 8A to 8D.

Subsequently, a method for manufacturing a transistor having an offset gate structure is described.

According to a method for manufacturing a semiconductor device of the present invention, a transistor having an offset gate structure in which a gate electrode does not overlap a source region or a drain region can also be formed over a substrate provided with a transistor having an Lov region, a transistor having an Loff region, or a transistor in which a source region or a drain region is in contact with a channel formation region. In a transistor having an offset gate structure, a region between a source region or a drain region and a region of an active layer that is overlapped with a gate electrode is referred to as an offset region. An electric field in the vicinity of a drain region is relieved and a transistor can be made pressure tightness high by providing an offset region on a drain region side.

Figure 5A:
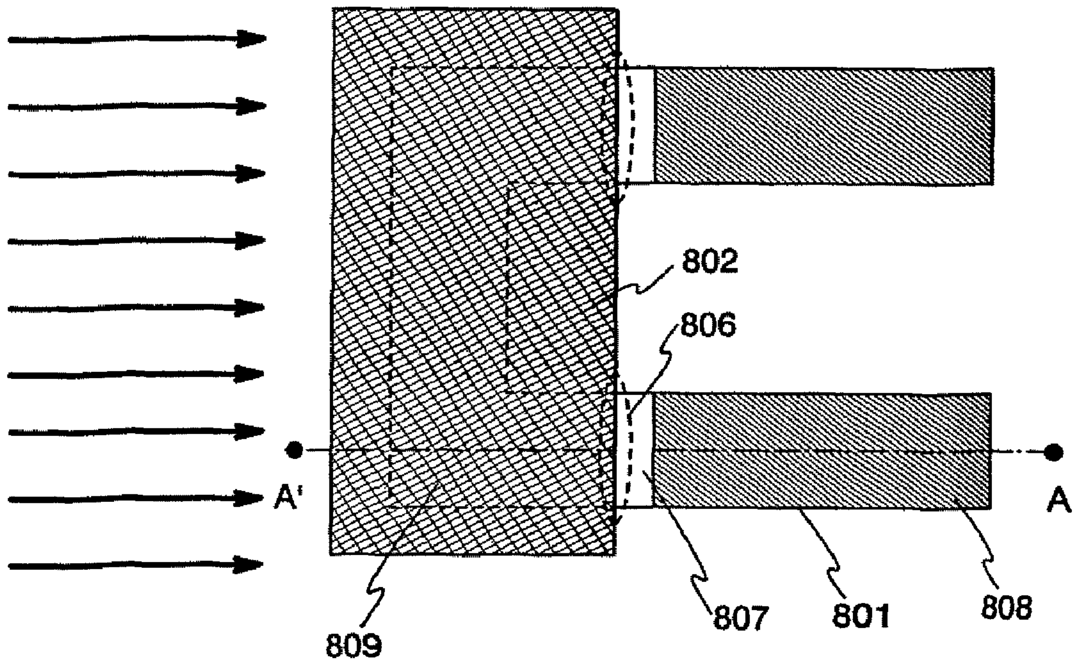
FIGS. 5A and 5B show a method for manufacturing a TFT having an offset region.
Figure 5B:
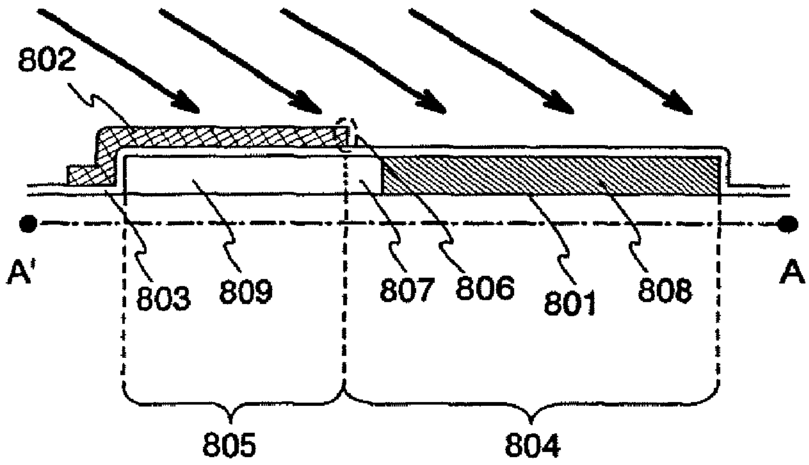

FIG. 5A shows a top view of an active layer 801 and a gate electrode 802 functioning as a mask, at the time of obliquely performing ion implantation. A cross-sectional view taken along a line A-A' in FIG. 5A is shown in FIG. 5B.

Arrow show an implantation direction at the time of ion implantation and obliquely intersect with a surface of the active layer 801. The active layer 801 and the gate electrode 802 overlap each other with a gate insulating film 803 therebetween. In the present invention, a region 805 of the active layer 801 that is overlapped with the gate electrode 802 is disposed closer to a dopant implantation direction side than an exposed region 804 without being overlapped with the gate electrode 802. Namely, an edge portion 806 of the gate electrode 802 overlapping the active layer 801, which is surrounded by a broken line, is directed in an opposite side of the implantation direction.

According to the above structure, an offset region 807 in which a dopant is blocked by the gate electrode 802 and is not implanted or is hard to be implanted compared to other exposed regions can be formed in a part of the exposed region 804 of the active layer 801 without being overlapped with the gate electrode 802 at the time of ion implantation. According to the above ion implantation, source/drain regions 808 and a channel formation region 809 can separately be formed in the exposed region 804 and the region 805 overlapped with the gate electrode 802, respectively. In FIGS. 5A and 5B, the two offset regions 807 are formed to sandwich the channel formation region 809, and the source/drain regions 808 are formed to sandwich the channel formation region 809 and the two offset regions 807.

Length of the offset region in an implantation direction (offset length) can be adjusted by an incidence angle of a dopant to an active layer at the time of ion implantation.

In the case of forming an offset region only on either a source region side or a drain region side, only one edge portion of a gate electrode overlapping an active layer may be directed in an opposite side of an implantation direction. In the other edge portion, a region overlapped with the gate electrode and an exposed region of the active layer are disposed to be in contact with each other along the implantation direction.

According to the above structure of the present invention, a TFT having an Lov region can separately be formed over a substrate provided with a TFT having an offset gate structure without providing a resist mask for forming an Lov region. Consequently, the number of resist masks and steps can be reduced, and a manufacturing cost can also be reduced. In addition, throughput in a step of ion implantation can be improved.

A cluster of crystal grains made of single crystal elongating along a scanning direction can be formed by using a continuous wave laser for crystallization of a semiconductor film used as an active layer. Thus, mobility of a TFT used for a thin film chip can be improved by crystallizing a semiconductor film using a continuous wave laser.

Figure 3A:
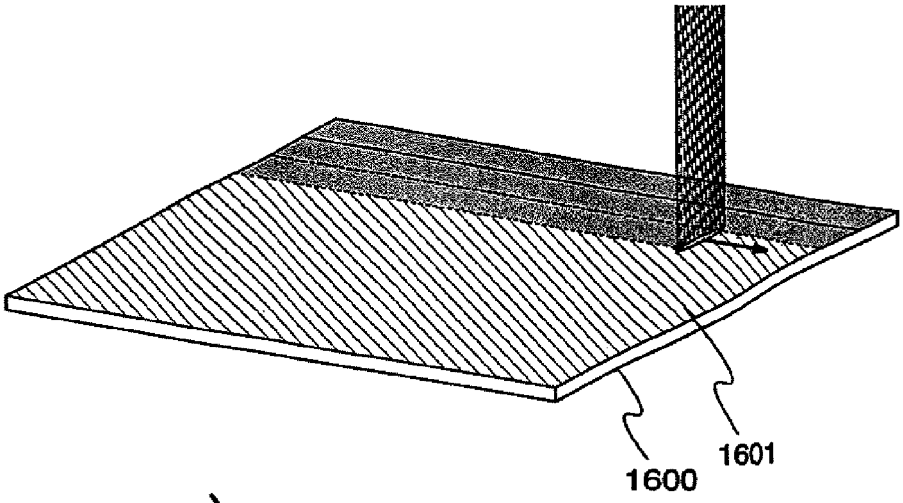
FIGS. 3A to 3C show crystallization of a semiconductor film by a laser beam, doping, and dicing.
Figure 3B:
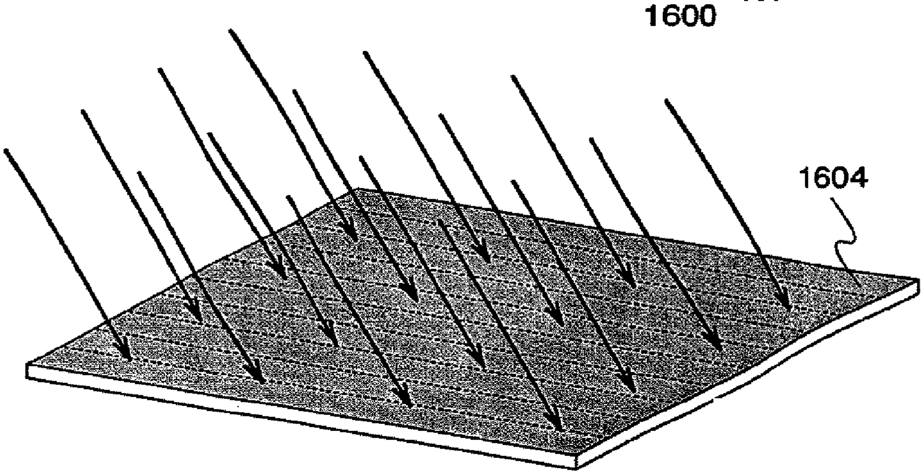

FIG. 3A shows a state of crystallizing a thin semiconductor film 1601 formed over a substrate 1600 by using a continuous wave laser beam. After crystallizing the semiconductor film 1601 as shown in FIG. 3A, the semiconductor film 1601 is patterned, and a gate electrode, a mask, or the like are formed. Thereafter, doping is performed as shown in FIG. 3B. The semiconductor film 1601 may be patterned before crystallization by a laser beam, or may be patterned after crystallization.

Figure 3C:
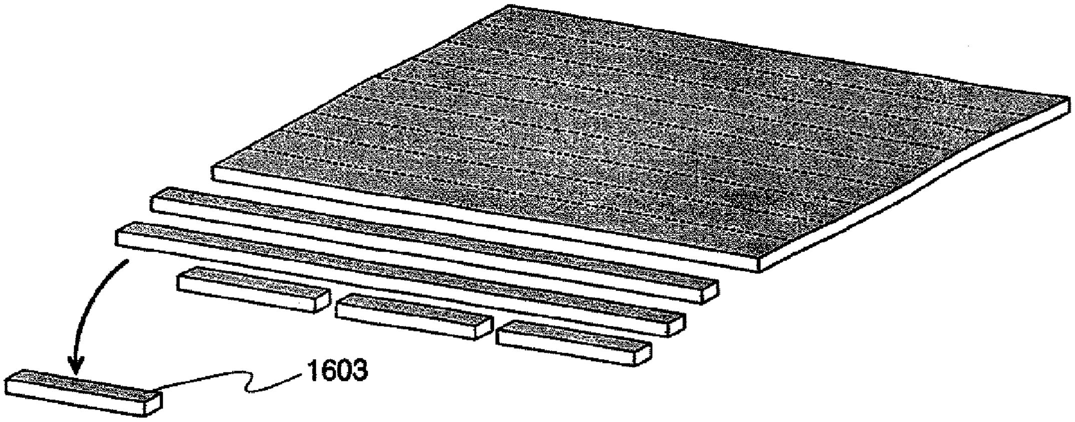

An implantation direction at the time of doping is set oblique to a semiconductor film (a semiconductor film 1604 after patterning in FIG. 3B), as indicated by arrows of continuous lines. A plurality of integrated circuits is formed over the substrate 1600 by activating a dopant and forming various insulating films, wirings, or the like. After the integrated circuits are formed, the substrate 1600 is divided, thereby forming a thin film chip 1603 in which the integrated circuits are separated from each other, as shown in FIG. 3C.

Figure 4A:
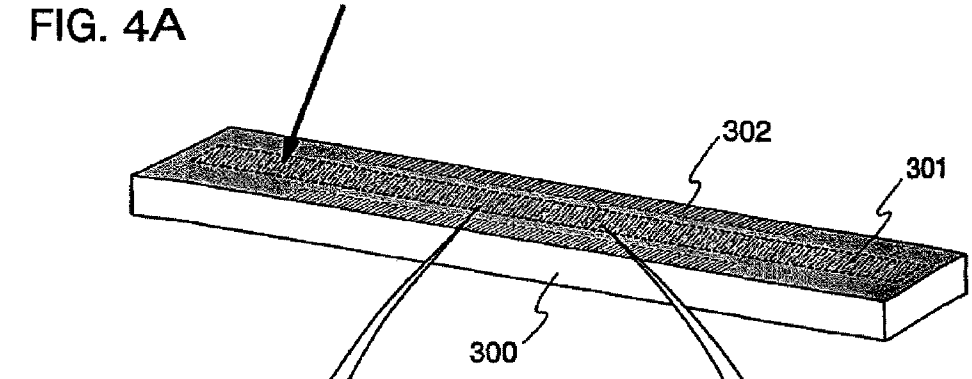
FIGS. 4A to 4E show layouts of each transistor in a thin film chip in which a TFT having an Loff region and a TFT having an Lov region are formed.

Subsequently, a layout of each transistor in a thin film chip is described, in which a TFT in which a source region and a drain region are in contact with a channel formation region and a TFT having an Lov region are formed. FIG. 4A shows an external view of a thin film chip. As for a thin film chip shown in FIG. 4A, an integrated circuit 301 formed by using a thin semiconductor film, and a connection terminal 302 are formed over a substrate 300. In FIG. 4A, arrows show a dopant implantation direction. For example, a TFT in which a source region and a drain region are in contact with a channel formation region and a TFT having an Lov region are formed in the integrated circuit 301.

Figure 4B:
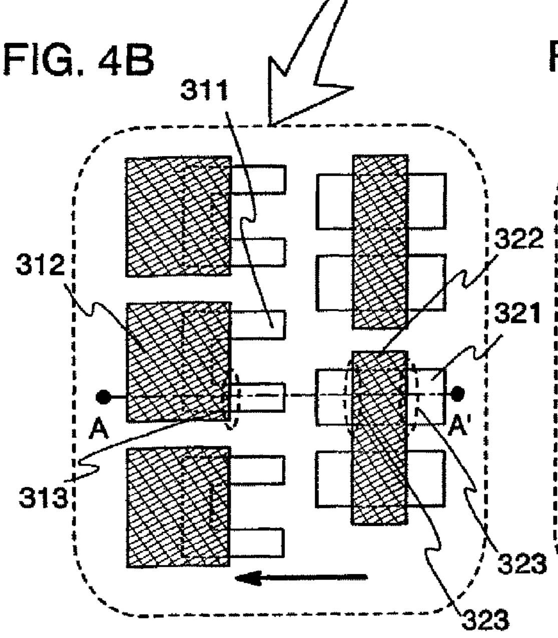
Figure 4C:
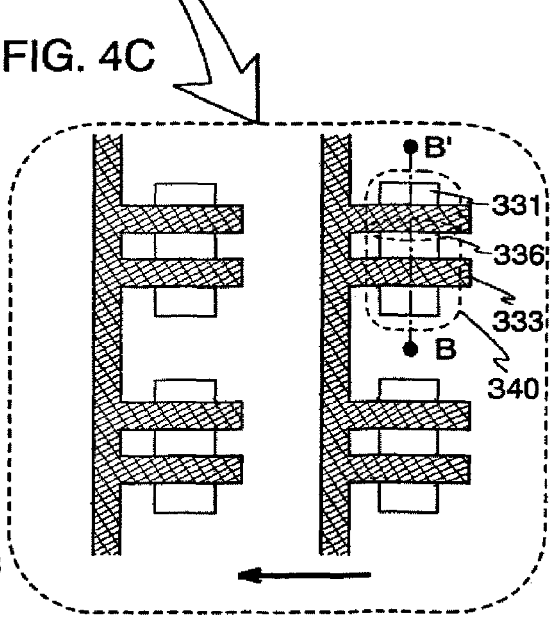

FIG. 4B shows a top view of the TFT having an Lov region, which is included in the integrated circuit 301, and FIG. 4C shows a top view of the TFT in which a source region and a drain region are in contact with a channel formation region, which is included in the integrated circuit 301.

In the TFT having an Lov region, an edge portion 313 of a gate electrode 312 overlapping an active layer 311 is directed to the implantation direction side as shown in FIG. 4B. In the case of forming an Lov region only on either a source region side or a drain region side, only one edge portion 323 of a gate electrode 322 overlapping an active layer 321 may be directed to the implantation direction. Alternatively, an edge portion of the gate electrode overlapping the active layer may be directed to the implantation direction only on one side of the source region side or the drain region side. On the other side, a region overlapped with the gate electrode and an exposed region of the active layer may be disposed to be in contact with each other along the implantation direction.

Figure 4D:
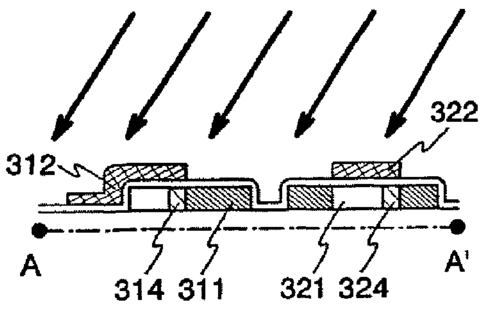

FIG. 4D shows a cross-sectional view taken along a line A-A' in FIG. 4B after ion implantation. As shown in FIG. 4D, an Lov region 314 and an Lov region 324 can be formed in the active layer 311 and the active layer 321 respectively by the ion implantation from an oblique implantation direction.

As shown in FIG. 4C, a TFT 340 in which a source region and a drain region are in contact with a channel formation region is disposed so that a region of an active layer 331 that is overlapped with a gate electrode 333 and an exposed region of the active layer 331 are in contact with each other along the implantation direction. In other words, an edge portion 336 of the gate electrode 333 overlapping the active layer 331 is along the implantation direction.

Figure 4E:
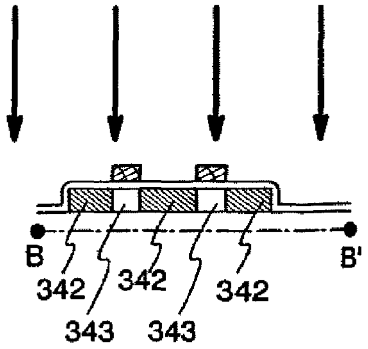

FIG. 4E shows a cross-sectional view taken along a line B-B' in FIG. 4C after ion implantation. As shown in FIG. 4E, only a channel formation region 343 and source/drain regions 342 can be formed in the active layer 331 even by performing ion implantation from an oblique implantation direction.

With reference to FIGS. 4A to 4E, an example of forming a TFT in which a source region and a drain region are in contact with a channel formation region over a substrate provided with a TFT having an Lov region is described. However, the present invention is not limited to this structure. In the case of forming a TFT having an Loff region and a TFT having an Lov region over one substrate, an edge portion of a resist mask overlapping an active layer may be along an implantation direction in a TFT in which an Loff region is formed. In the case of forming a TFT having an offset region over a substrate provided with a TFT having an Lov region, an edge portion of a gate electrode overlapping an active layer in a TFT having an offset region may be directed in an opposite side of the implantation direction.

Thus, as for a semiconductor device manufactured by using a manufacturing method of the present invention, all positions of Lov regions with respect to channel formation regions are uniform on the implantation direction side, as long as the TFTs have the same conductivity. In TFTs in which a source region and a drain region are in contact with a channel formation region, a channel formation region and a source/drain region are in contact with each other along the implantation direction, as long as the TFTs have the same conductivity. In TFTs having Loff regions, channel formation regions and the Loff regions are in contact with each other along the implantation direction, as long as the TFTs have the same conductivity. In TFTs having offset regions, positions of the offset regions with respect to channel formation regions is uniform on an opposite side of the implantation direction side, as long as the TFTs have the same conductivity.

According to the above structure of the present invention, a TFT having an Lov region can separately be formed over a substrate provided with a TFT having an Loff region, a TFT in which a source region and a drain region are in contact with a channel formation region, or the like without providing a resist mask for forming an Lov region. Consequently, the number of resist masks and steps can be reduced, and a manufacturing cost can also be reduced. In addition, throughput in a step of ion implantation can be improved.

Figure 7A:
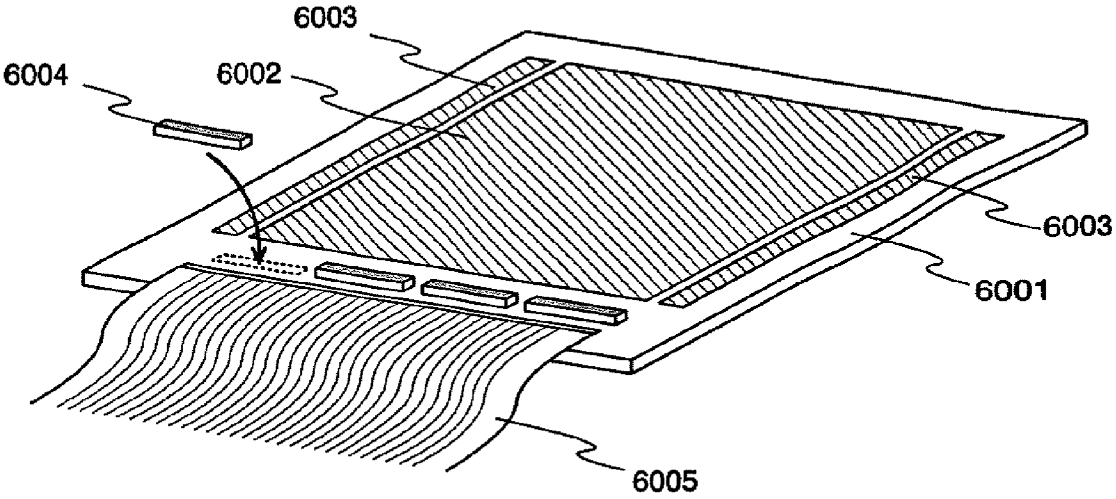
FIGS. 7A and 7B are external views of a semiconductor display device on which a thin film chip is mounted.

Subsequently, states of mounting a thin film chip formed by using the above manufacturing method on a substrate over which a pixel portion is formed is described with reference to FIGS. 7A and 7B. In FIG. 7A, a pixel portion 6002 and a scanning line driver circuit 6003 are formed over a substrate 6001. Then, a signal line driver circuit formed in a thin film chip 6004 is mounted on the substrate 6001. Specifically, the signal line driver circuit formed in the thin film chip 6004 is attached to the substrate 6001 and is electrically connected to the pixel portion 6002. In addition, reference numeral 6005 denotes an FPC. Electric potential of power supply, various signals, and the like are supplied to each of the pixel portion 6002, the scanning line driver circuit 6003, and the signal line driver circuit formed on the thin film chip 6004 through the FPC 6005.

Figure 7B:
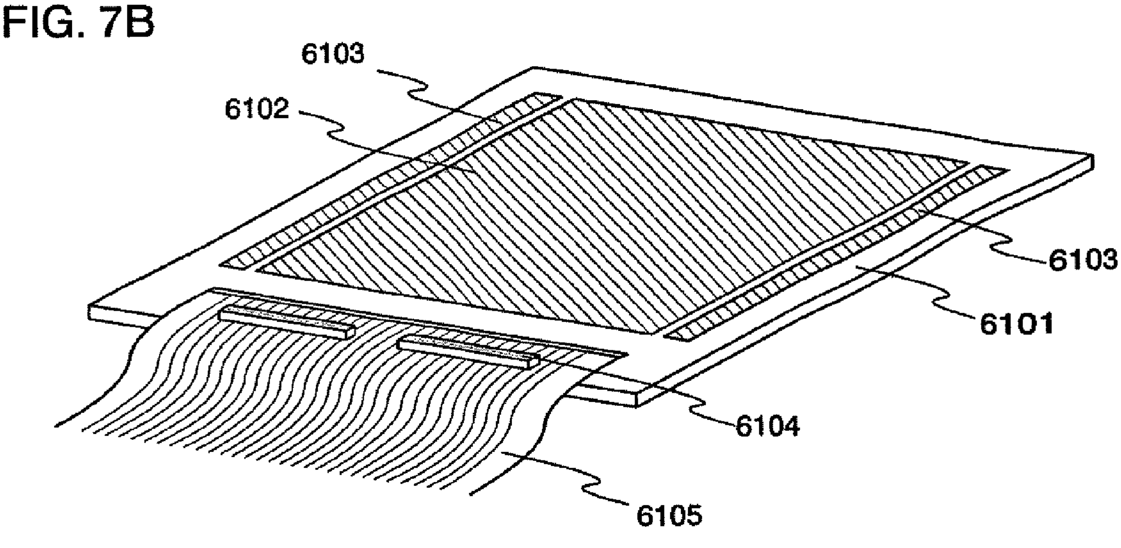

In FIG. 7B, a pixel portion 6102 and a scanning line driver circuit 6103 are formed over a substrate 6101. Then, a signal line driver circuit formed in a thin film chip 6104 is further mounted on an FPC 6105 that is mounted on the substrate 6101. Electric potential of power supply, various signals, and the like are supplied to each of the pixel portion 6102, the scanning line driver circuit 6103, and the signal line driver circuit formed on the thin film chip 6104 through the FPC 6105.

A method for mounting a thin film chip is not particularly limited, and a known COG, wire bonding, TAB, or the like can be used. A position where a thin film chip is mounted is not limited to the position shown in FIGS. 7A and 7B, as long as electrical connection is possible. An example of forming only a signal line driver circuit in a thin film chip is shown in FIGS. 7A and 7B; however, a scanning line driver circuit may be formed in a thin film chip, or a controller, a CPU, a memory, or the like may be formed in a thin film chip and be mounted. Not a whole signal line driver circuit or scanning line driver circuit but only a part of a circuit constituting each driver circuit may be formed in a thin film chip.

In a semiconductor display device in which a driver circuit is mounted as a thin film chip, a transistor used for a pixel portion is not limited to a TFT formed of an amorphous semiconductor film such as amorphous silicon. The TFT may be a TFT using a microcrystalline semiconductor film or a polycrystalline semiconductor film. It may be a transistor formed by using single crystal silicon or a transistor using SOI. Further, it may be a transistor using an organic semiconductor or a transistor using a carbon nanotube. A yield can be improved and a process can easily be optimized to characteristics of each circuit by separately forming an integrated circuit such as a driver circuit in a thin film chip and mounting it, compared with the case of forming all circuits over a substrate provided with a pixel portion.

Subsequently, a specific method for manufacturing a semiconductor display device of the present invention is described. Here, an n-channel TFT having an Lov region which is used for a driver circuit, a p-channel TFT in which a source region and a drain region are in contact with a channel formation region and which is used for a driver circuit, and an n-channel TFT having an Loff region which is used for a pixel portion are exemplified for explanation.

Figures 10A, 10B, 10C, 10D:
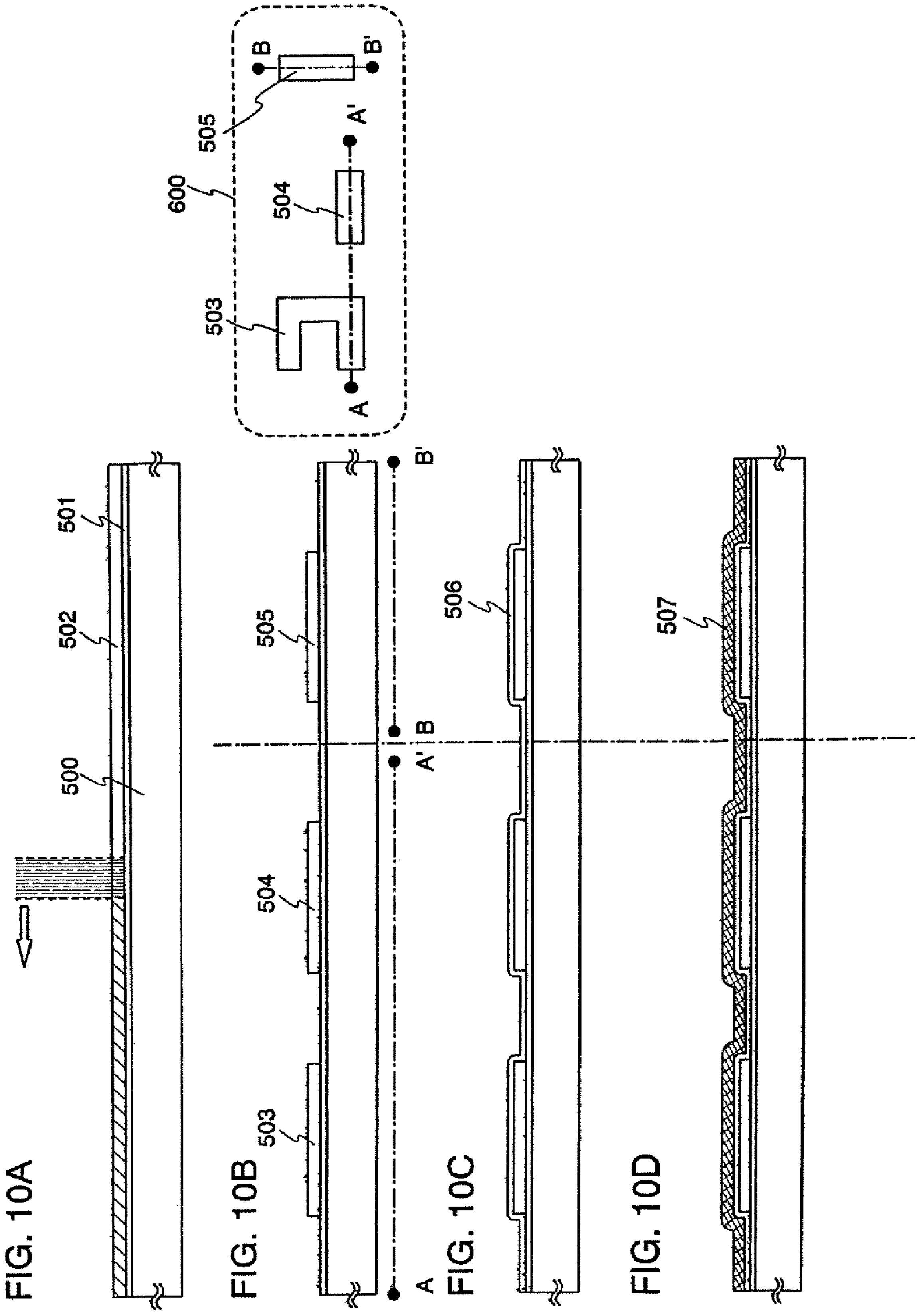
FIGS. 10A to 10D show a method for manufacturing a semiconductor device of the present invention.

First, a base film 501 is formed on an insulating surface of a substrate 500 as shown in FIG. 10A.

A glass substrate such as barium borosilicate glass or aluminoborosilicate glass, a quartz substrate, a ceramic substrate, or the like can be used as the substrate 500. Further, a metal substrate including an SUS substrate or a silicon substrate on a surface of which an insulating film is formed may be used. Although a substrate made from a synthetic resin having flexibility, such as plastics, generally tends to have a lower heat resistance temperature compared to the above described substrate, it can be used as the substrate 500 as long as it can withstand the process temperature in the manufacturing step.

The base film 501 is formed in order to prevent an alkaline metal such as Na or an alkaline earth metal, contained within the substrate 500 from diffusing into a semiconductor film and exerting an adverse influence on semiconductor device characteristics. The base film 501 is therefore formed by using an insulating film capable of suppressing the diffusion of an alkaline metal or an alkaline earth metal into the semiconductor film, such as a silicon oxide film, a silicon nitride film, or a silicon nitride oxide film. In this embodiment mode, a silicon nitride oxide film is formed by plasma CVD to have a film thickness of from 10 nm to 400 nm (preferably from 50 nm to 300 nm).

Note that the base film 501 may be a single layer, or may be a laminate of a plurality of insulating films. It is effective to form a base film in order to prevent impurity diffusion in the case of using a substrate that contains a certain amount of an alkaline metal or an alkaline earth metal, such as a glass substrate, an SUS substrate, or a plastic substrate. However, a base film is not necessarily required to be formed when using a quartz substrate or the like, with which impurity diffusion does not become a problem.

Subsequently, a semiconductor film 502 is formed without exposing to atmospheric air, after forming the base film 501 by PCVD. A film thickness of the semiconductor film 502 is set from 25 nm to 100 nm (preferably from 30 nm to 60 nm). Note that the semiconductor film 502 may be an amorphous semiconductor or a polycrystalline semiconductor. Further, the semiconductor can use not only silicon but also silicon germanium. It is preferable that germanium concentration be on the order of from 0.01 atomic % to 4.5 atomic % when silicon germanium is used.

Next, the semiconductor film 502 is crystallized by a laser crystallization method as shown in FIG. 10A. When a polycrystalline semiconductor is used for the semiconductor film 502, an amorphous semiconductor is formed first. Then, the amorphous semiconductor is crystallized by using a known crystallization method. A method for performing crystallization by RTA or heating using an annealing furnace, a method for performing crystallization by laser beam irradiation, a method for performing crystallization by using a catalyst metal, a method for performing crystallization by using infrared light, or the like can be given as a known method of crystallization. In addition, these crystallization methods may be combined to perform crystallization.

In the case of using a laser, a pulsed laser typified by an excimer laser, a YAG laser, a $YVO_4$ laser, or the like can be used to perform crystallization. For example, in the case of using a YAG laser, a wavelength of a second harmonic, which tends to easily be absorbed in the semiconductor film, is employed. An oscillating frequency is set from 30 kHz to 300 kHz, energy density is set from 300 mJ/cm$^2$ to 600 mJ/cm$^2$ (typically from 350 mJ/cm$^2$ to 500 mJ/cm$^2$), and scanning speed may be set so that several irradiation shots can be emitted at an arbitrary point.

In addition, a crystal having a large grain size can be obtained by laser beam irradiation of from a second harmonic to a fourth harmonic of a fundamental wave with the use of a solid laser capable of continuously oscillating in crystallization of an amorphous semiconductor film. Typically, a second harmonic (532 nm) or a third harmonic (355 nm) of an Nd:$YVO_4$ laser (fundamental wave of 1064 nm) is preferably employed. A laser beam emitted from a continuous wave $YVO_4$ laser is converted to a harmonic by a nonlinear optical device to have an output power of 10 W. There is also a method for emitting a harmonic by putting $YVO_4$ crystals and non-linear optical elements in a resonator. Preferably, the laser beam is shaped by using an optical system so that it becomes a rectangular shape or an elliptical shape on an irradiation face, and is radiated to an object to be treated. Energy density at the time needs to be on the order of from 0.01 MW/cm$^2$ to 100 MW/cm$^2$ preferably from 0.1/cm$^2$ to 10 MW/cm$^2$). Then, the semiconductor film 502 is moved relative to a laser beam at the rate of approximately from 10 cm/sec to 2000 cm/sec to be irradiated therewith.

A known gas laser or solid laser of continuous wave can be used as a continuous wave laser. As the gas laser, an Ar laser, a Kr laser, and the like are cited. As the solid laser, a YAG laser, a $YVO_4$ laser, a YLF laser, a $YAlO_3$ laser, a $Y_2O_3$ laser, a glass laser, a ruby laser, an alexandrite laser, a Ti:sapphire laser, and the like are cited. A harmonic to a fundamental wave can be obtained by using a non-linear optical element.

Note that mobility of a TFT can be increased by arranging a scanning direction of a laser beam and a moving direction of a carrier in a channel formation region in the same direction as much as possible.

Island semiconductor films 503 to 505 used as an active layer are formed as shown in FIG. 10B by patterning the semiconductor film 502 after the crystallization. A film thickness of the island semiconductor films 503 to 505 is set from 25 nm to 100 nm (more preferably, from 30 nm to 60 nm).

A top view corresponding to FIG. 10B is shown in a region surrounded by a broken line 600. A cross-sectional view taken along a line A-A' and a cross-sectional view taken along a line B-B' within the broken line 600 correspond to FIG. 10B.

Subsequently, a gate insulating film 506 is formed to cover the island semiconductor films 503 to 505 as shown in FIG. 10C. A film thickness of the gate insulating film is decreased on the order of from 10 nm to 20 nm during later dry etching for forming a gate electrode; therefore, it is preferable that the film thickness of the gate insulating film be set with the decrease in mind. Specifically, the gate insulating film is formed to have a thickness on the order of from 40 nm to 150 nm (more preferably, from 60 nm to 120 nm).

Silicon oxide, silicon nitride, silicon nitride oxide, and the like can be used for the gate insulating film, for example. Further, plasma CVD, sputtering, and the like can be used as a film formation method. For example, in the case of forming the gate insulating film using silicon oxide by plasma CVD, film formation may be performed by using a mixed gas of tetraethyl orthosilicate (TEOS) and $O_2$, at a reaction pressure of 40 Pa, a substrate temperature of from 300° C. to 400° C., and a high-frequency (13.56 MHz) power density of from 0.5 $W/cm^2$ to 0.8 $W/cm^2$.

Further, aluminum nitride can also be used for the gate insulating film. The thermal conductivity of aluminum nitride is relatively high, and heat generated from a TFT can efficiently be dissipated. In addition, a gate insulating film in which aluminum nitride is laminated after forming silicon oxide, silicon oxynitride, or the like, which contains no aluminum, may also be used as the gate insulating film.

Subsequently, a conductive film 507 is formed on the gate insulating film 506 as shown in FIG. 10D. The conductive film 507 may be a single layer, or may have a laminated structure including a plurality of layers such as two or three layers, if necessary. In this embodiment mode, the conductive film 507 is formed using W to have a film thickness of 300 nm.

Specifically, an element selected from Ta, W, Ti, Mo, Al, and Cu, or an alloy or a compound having one of these elements as its main component may be used in forming each conductive film. For example, a combination of a conductive film in which Ta is used in a first layer and W is used in a second layer, a conductive film in which TaN is used in the first layer and Al is used in the second layer, and a conductive film in which TaN is used in the first layer and Cu is used in the second layer can all be considered. Further, an AgPdCu alloy may be used in either of the first layer or the second layer. A three layer structure in which W, an alloy of Al and Si (Al—Si), and TiN are sequentially laminated may be used. Tungsten nitride may also be used in place of W, an alloy of Al and Ti (Al—Ti) may also be used in place of the alloy of Al and Si (Al—Si), and Ti may be used in place of TiN. However, in the case of forming a plurality of conductive films, such a material that can secure an etching selectivity ratio is used in order to have a difference in the width of the conductive film in each layer in the channel length direction after etching.

For example, the conductive film 507 may be formed by laminating a conductive film made of TaN having a thickness of from 20 nm to 100 nm and a conductive film made of W having a thickness of from 100 nm to 400 nm. In this case, a film of TaN is formed at film formation speed of approximately 40 nm/min. This is achieved by using a Ta target having a purity of 99.99%, with an internal chamber temperature set to room temperature, a gas flow rate of Ar set to 50 ml/min, a gas flow rate for $N_2$ set to 10 ml/min, an internal chamber pressure set to 0.6 Pa, and a film formation electric power set to 1 kW. In addition, a film of W is formed at film formation speed of approximately 390 nm/min. This is achieved by using a W target having a purity of 99.99%, with an internal chamber temperature set to 230° C., a gas flow rate of Ar set to 100 ml/min, an internal chamber pressure set to 1.5 Pa, and a film formation electric power set to 6 kW.

Note that it is important to select an optimal etching gas according to a material of a conductive film. Further, a material of each conductive layer is not limited to the one described in this embodiment mode.

Figures 11A, 11B, 11C:
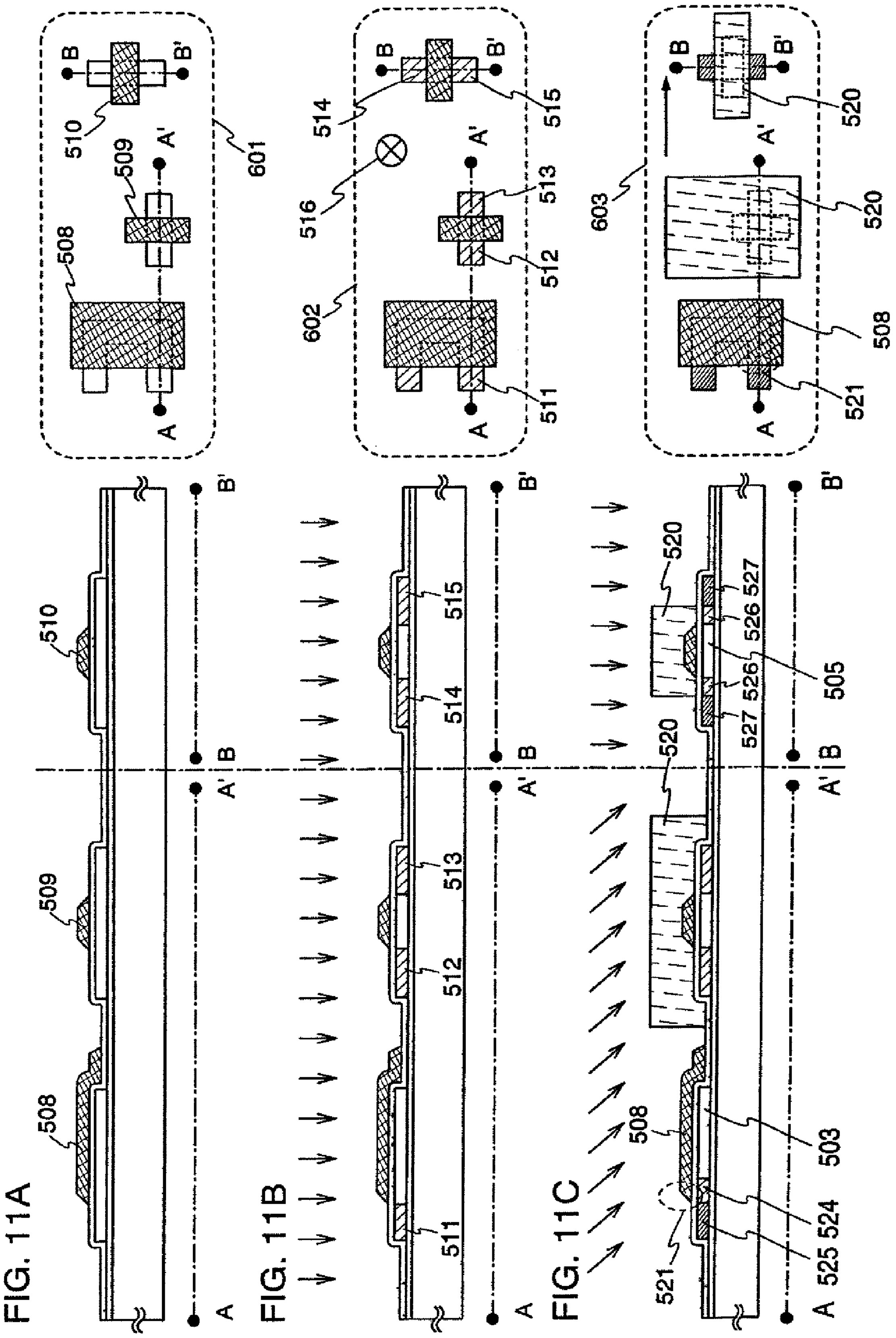
FIGS. 11A to 11C show a method for manufacturing a semiconductor device of the present invention.

Subsequently, the conductive film 507 is patterned to form gate electrodes 508 to 510 as shown in FIG. 11A. In this embodiment mode, etching is performed by using inductively coupled plasma (ICP) etching. Etching is performed by using a mixed gas of $Cl_2$ and $CF_4$ as an etching gas and applying RF (13.56 MHz) electric power of 3.2 $W/cm^2$ under the pressure of 1 Pa to generate plasma. RF (13.56 MHz) power of 224 $mW/cm^2$ is applied to a substrate side (sample stage), thereby applying a substantially negative self-bias voltage. An etching rate of a W film is approximately 100 nm/min on this condition. According to the etching, side faces of the gate electrodes 508 to 510 become slightly tapered shapes. When etching is performed so that no conductive film residue remains, a surface of the gate insulating film 506 that is not covered with the gate electrodes 508 to 510 may undergo etching on the order of from 5 nm to 10 nm or more.

A top view corresponding to FIG. 11A is shown in a region surrounded by a broken line 601. A cross-sectional view taken along a line A-A' and a cross-sectional view taken along a line B-B' in the broken line 601 correspond to FIG. 11A.

Subsequently, as shown in FIG. 11B, an impurity (dopant) imparting n-type conductivity is added to the island semiconductor films 503 to 505, using the gate electrodes 508 to 510 as a mask (first doping treatment). Doping is performed by ion implantation. Doping is performed with a dose amount of from $1\times10^{13}$ $atoms/cm^2$ to $1\times10^{15}$ $atoms/cm^2$, and an acceleration voltage of from 30 kV to 90 kV. A Group 5 element such as P, As, or Sb, or a Group 6 element such as S, Te, or Se, which functions as a donor, may be used as the impurity element imparting n-type conductivity. P is used in this embodiment mode. First impurity regions 511 to 515 are formed in a self-aligned manner according to the first doping treatment. An impurity element imparting n-type conductivity is added to the first impurity regions 511 to 515 at a concentration range of from $1\times10^{18}$ $atoms/cm^3$ to $1\times10^{20}$ $atoms/cm^3$.

A top view corresponding to FIG. 11B is shown in a region surrounded by a broken line 602. A cross-sectional view taken along a line A-A' and a cross-sectional view taken along a line B-B' in the broken line 602 correspond to FIG. 11B. In addition, reference numeral 516 shows an implantation direction at the time of doping. In ion implantation shown in FIG. 11B, an implantation direction is directed nearly perpendicular to the substrate 500 from a top face of the substrate 500.

Next, as shown in FIG. 11C, a resist mask 520 is formed to cover the whole island semiconductor film 504 and a part of the island semiconductor film 505, and then, a second doping treatment is performed. In the second doping treatment, an acceleration voltage is set from 50 kV to 150 kV, and a dose amount is set from $1\times10^{15}$ $atoms/cm^2$ to $1\times10^{17}$ $atoms/cm^2$.

A top view corresponding to FIG. 11C is shown in a region surrounded by a broken line 603. A cross-sectional view taken along a line A-A' and a cross-sectional view taken along a line B-B' in the broken line 603 correspond to FIG. 11C. In addition, arrows show an implantation direction at the time of doping. In the second doping treatment, an implantation direction is kept oblique to the surface of the island semiconductor film 503 so that an impurity is added to a part of an overlapping region of the gate electrode 508 and the island semiconductor film 503. Note that an edge portion 521 of the gate electrode 508 overlapping the island semiconductor film 503 is directed to the implantation direction. In addition, a region of the island semiconductor film 505 that is overlapped with the resist mask 520 and an exposed region without being overlapped are disposed to be in contact with each other along the implantation direction.

According to the second doping treatment, in the island semiconductor film 505, a second impurity region 526 is formed in a region overlapped with the resist mask 520 and a third impurity region 527 which is formed by further adding an impurity to the first impurity regions 514 and 515 is formed. In addition, in the island semiconductor film 503, a fourth impurity region 524 is formed in a region overlapped with the gate electrode 508 and a third impurity region 525 which is formed by further adding an impurity to the first impurity region 511 is formed. An impurity element imparting n-type conductivity is added to the second impurity region 526 at a concentration range of from $5\times10^{17}$ atoms/cm$^3$ to $5\times10^{19}$ atoms/cm$^3$, and an impurity element imparting n-type conductivity is added to the third impurity region 525 at a concentration range of from $1\times10^{19}$ atoms/cm$^3$ to $5\times10^{21}$ atoms/cm$^3$. A concentration of the impurity element in the fourth impurity region 524 depends also on an incidence angle of a dopant, and has a concentration gradient to some extent in a channel-length direction. The concentration of the impurity element in the fourth impurity region 524 is lower than that in the third impurity region 525.

The second impurity region 526 corresponds to an Loff region; the third impurity region 527, a source/drain region; the third impurity region 525, a source/drain region; and the fourth impurity region 524, an Lov region.

Note that the island semiconductor 504 in which a p-channel TFT is formed does not need to be doped with an impurity imparting n-type conductivity by the first doping treatment shown in FIG. 11B. Therefore, it may be covered with a resist mask at the time of the first doping treatment. The resist mask may not be provided intentionally for reducing the number of resist masks and concentration of an impurity imparting p-type conductivity may be increased, so that conductivity of the island semiconductor film may be inverted to p-type. In this embodiment mode, the case of inverting conductivity of the island semiconductor film is described.

Figures 12A, 12B, 12C:
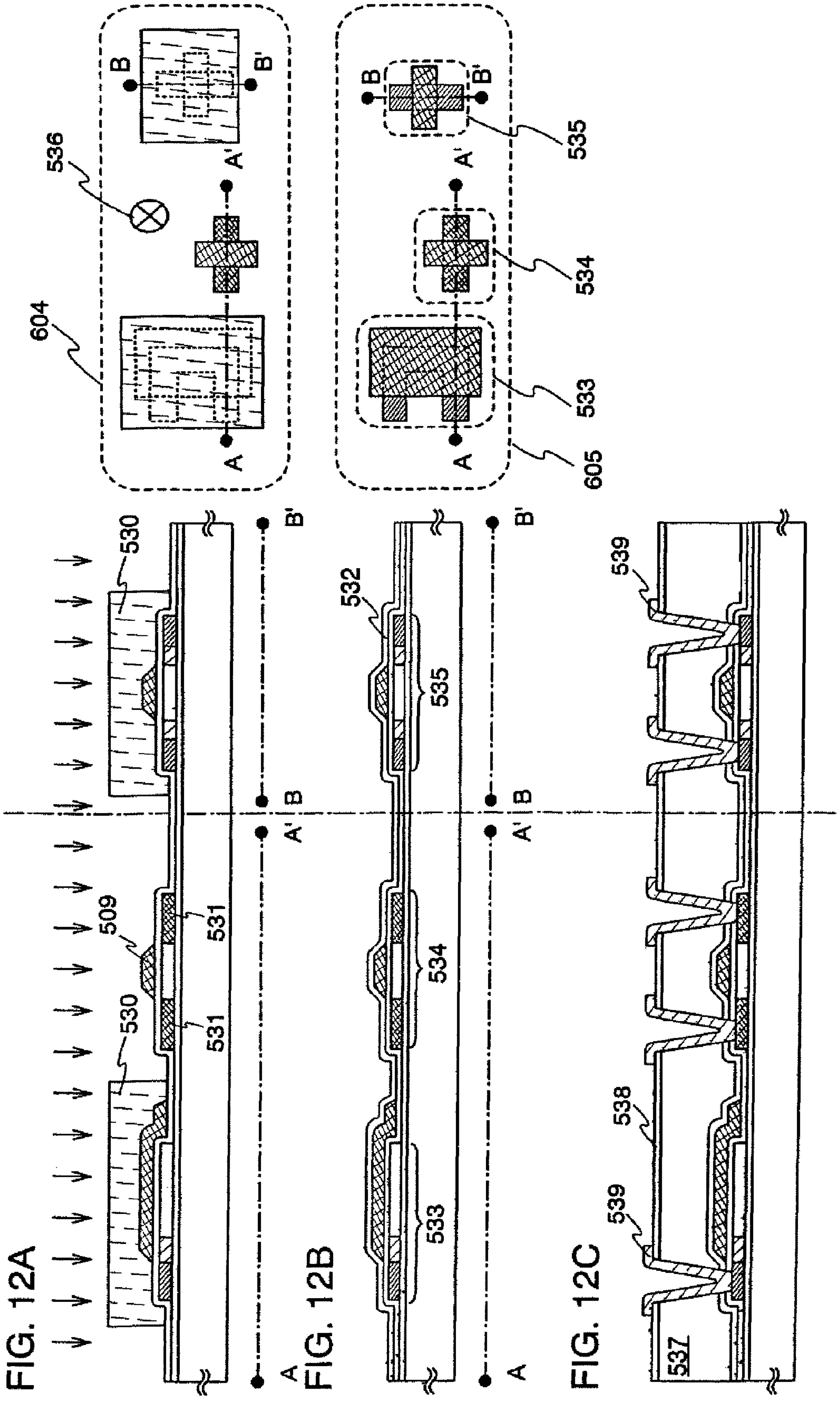
FIGS. 12A to 12C show a method for manufacturing a semiconductor device of the present invention.

As shown in FIG. 12A, the island n-channel semiconductor films 503 and 505 are covered with a resist mask 530 made of a resist, and an impurity imparting p-type conductivity is doped into the island semiconductor film 504 (third doping treatment). In the third doping treatment, the gate electrode 509 functions as a mask, and a fifth impurity region 531 in which an impurity element imparting p-type conductivity is added to the island semiconductor film 504 used for a p-channel TFT is formed. The fifth impurity region 531 is formed by ion implantation using diborane ($B_2H_6$) in this embodiment mode. In the fifth impurity region 531, a doping treatment is performed so that concentration of an impurity element imparting p-type conductivity is from $2\times10^{20}$ atoms/cm$^3$ to $2\times10^{21}$ atoms/cm$^3$. Accordingly, p-type becomes dominant. Therefore, the fifth impurity region 531 functions as a source/drain region of a p-channel TFT.

A top view corresponding to FIG. 12A is shown in a region surrounded by a broken line 604. A cross-sectional view taken along a line A-A' and a cross-sectional view taken along a line B-B' in the broken line 604 correspond to FIG. 12A. In addition, reference numeral 536 shows an implantation direction at the time of doping. In ion implantation shown in FIG. 12A, an implantation direction is directed nearly perpendicular to the substrate 500 from a top face of the substrate 500. In the case of forming an Lov region also in the p-channel TFT, an ion implantation direction is set oblique so that an impurity is added to a region of the island semiconductor film 503 that is overlapped with the gate electrode 509.

According to the above described steps, impurity regions are formed in the island semiconductor films 503 to 505.

Subsequently, a first interlayer insulating film 532 is formed to cover the island semiconductor films 503 to 505, the gate insulating film 506, and the gate electrodes 508 to 510 as shown in FIG. 12B. The first interlayer insulating film 532 can be formed by using an insulating film including silicon, such as silicon oxide, silicon nitride, or silicon oxynitride and has a thickness on the order of from 100 mm to 200 nm.

Next, a heat treatment is performed in order to activate the impurity element added to the island semiconductor films 503 to 505. This step can be performed by thermal annealing using an annealing furnace, by laser annealing, or by rapid thermal annealing (RTA). For example, in the case of performing activation by thermal annealing, it is performed at a temperature of from 400° C. to 700° C. (preferably from 500° C. to 600° C.) under a nitrogen atmosphere containing oxygen at a concentration of equal to or less than 1 ppm, preferably equal to or less than 0.1 ppm. Further, a heat treatment is performed at a temperature of from 300° C. to 450° C. for from 1 hour to 12 hours under an atmosphere containing hydrogen of from 3% to 100%, thus performing hydrogenation of the island semiconductor film. This step is performed to terminate a dangling bond by thermally excited hydrogen. Plasma hydrogenation (using hydrogen excited by plasma) may also be performed as another means of hydrogenation. The activation treatment may be performed before forming the first interlayer insulating film 532.

According to the series of above described steps, an n-channel T'FT 533 having an Lov region, a p-channel TFT 534 in which a source region and a drain region are in contact with a channel formation region, and an n-channel TFT 535 having an Loff region can be formed over one substrate.

A top view corresponding to FIG. 12B is shown in a region surrounded by a broken line 605. A cross-sectional view taken along a line A-A' and a cross-sectional view taken along a line B-B' in the broken line 605 correspond to FIG. 12B.

Subsequently, a second interlayer insulating film 537 and a third interlayer insulating film 538 are formed to cover the first interlayer insulating film 532 as shown in FIG. 12C. An organic resin film, an inorganic insulating film, organic polysiloxane, or the like can be used for the second interlayer insulating film 537. In this embodiment mode, the second interlayer insulating film 537 is formed by using non-photosensitive acrylic that is one of organic resin films.

Thereafter, the gate insulating film 506, the first interlayer insulating film 532, the second interlayer insulating film 537, and the third interlayer insulating film 538 are etched to form contact holes. Then, wirings 539 for forming a contact with the island semiconductor films 503 to 505 is formed.

After the step shown in FIG. 12C, a step of manufacturing an element (display element) that can display gradation in accordance with an electrical signal, such as a liquid crystal cell or a light emitting element used for a semiconductor display device is performed.

Note that the present invention is not necessarily limited to the manufacturing method described in this embodiment mode. The above described manufacturing method is specifically described as merely one embodiment mode of the present invention, and the present invention is not limited to the above embodiment mode. Various changes and modifications based on a technical idea of the invention are possible.

Subsequently, a method for electrically connecting a wiring or a terminal provided over a substrate and a thin film chip is described.

Figure 9A:
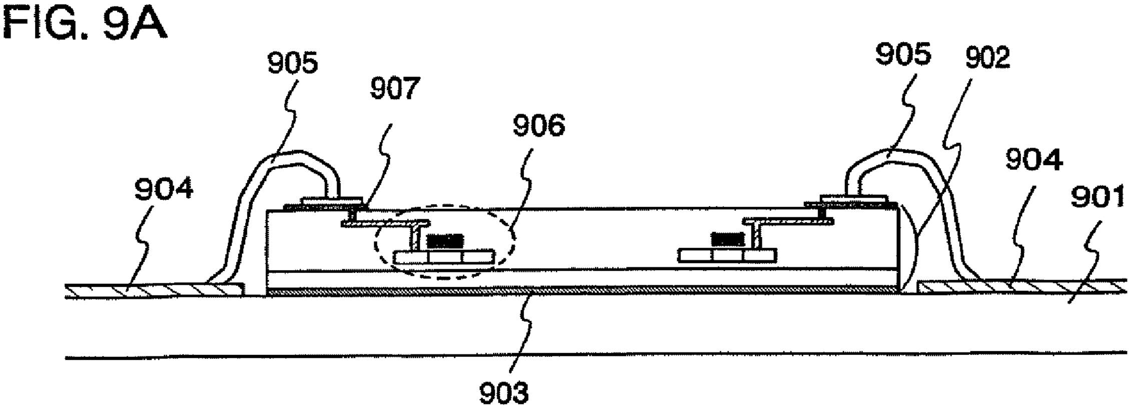
FIGS. 9A to 9C show a method for mounting a thin film chip.

FIG. 9A shows a cross-sectional structure of a thin film chip connected to a wiring or a terminal for extending by a wire-bonding method. Reference numeral 901 denotes a substrate, and 902 denotes a thin film chip. The thin film chip 902 is attached to the substrate 901 with an adhesive 903. A semiconductor element 906 is provided in the thin film chip 902 and is electrically connected to a pad 907 functioning as a terminal, formed on the surface of the thin film chip 902 so as to be exposed. A wiring or a terminal 904 is formed on the substrate 901 shown in FIG. 9A, and the pad 907 and the wiring or the terminal 904 are connected through a wire 905.

Figure 9B:
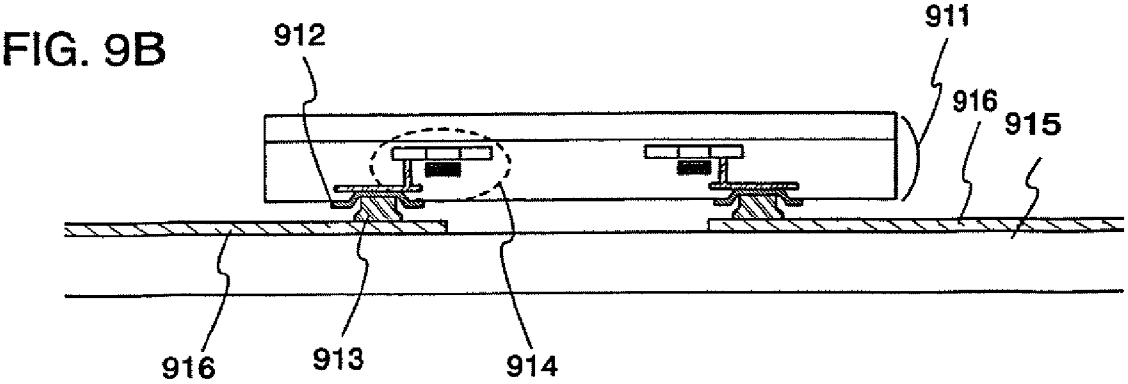

Subsequently, FIG. 9B shows a state that a thin film chip is connected to a substrate by a flip chip method. In FIG. 9B, a solder ball 913 is connected to a pad 912 that is formed on the surface of a thin film chip 911 to be exposed. Accordingly, a semiconductor element 914 formed in the thin film chip 911 is electrically connected to the solder ball 913 through the pad 912. The solder ball 913 is connected to a wiring or a terminal 916 formed on a substrate 915.

As a method for connecting the solder ball 913 and the wiring or the terminal 916, various methods such as thermo-compression or thermo-compression added with ultrasonic vibration can be used. An underfilling may be provided between the thin film chip 911 and the substrate 915 to fill a gap between solder balls after the thermo-compression for enhancing mechanical strength of a connecting portion and efficiency of thermal diffusion of heat generated in the thin film chip. The underfilling, although it is not always necessary to be used, can prevent poor electrical connection due to stress caused by mismatch of thermal expansion coefficient of the substrate and the thin film chip. In the case of bonding by thermo-compression added with ultrasonic vibration, poor electrical connection can be prevented compared with the case of bonding solely by thermo-compression. Particularly, it is effective for the case where the number of bumps to be connected is approximately more than 300.

The flip chip method is suitable for connection of a thin film chip having many terminals, since a pitch between pads is relatively kept wider than that of the case of a wire bonding method, even if the number of pads to be connected increases.

Note that the solder ball may be formed by a droplet discharging method which discharges nano-particle dispersed liquid.

Figure 9C:
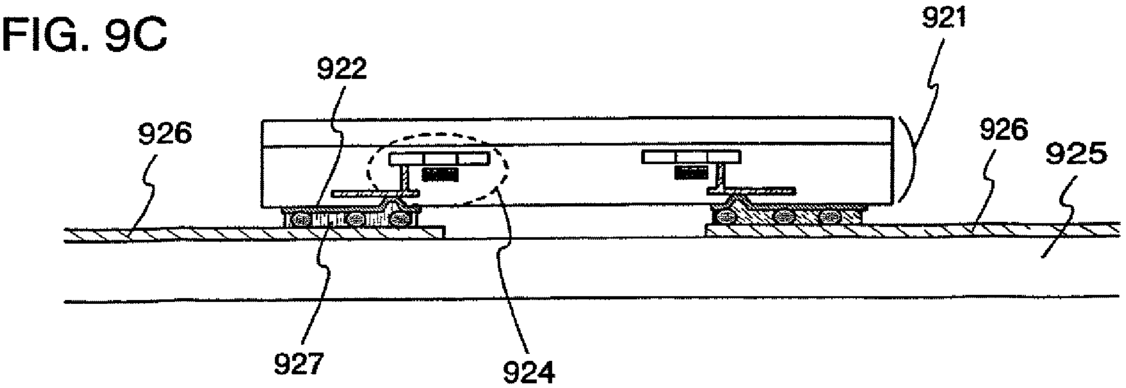

Subsequently, FIG. 9C show a state that a thin film chip is connected to a substrate by using an anisotropic conductive resin. In FIG. 9C, a pad 922 that is formed on the surface of a thin film chip 921 to be exposed is electrically connected to a semiconductor element 924 formed in the thin film chip 921. The pad 922 is connected to a wiring or a terminal 926 formed on a substrate 925 through an anisotropic conductive resin 927.

Note that a mounting method is not limited to the methods shown in FIGS. 9A to 9C. A wire bonding method and a flip chip method may be combined to mount a thin film chip.

Embodiment 1

In this embodiment, a relationship between an incidence angle of a dopant (impurity) in ion implantation and concentration of an Lov region is described.

Figure 13A:
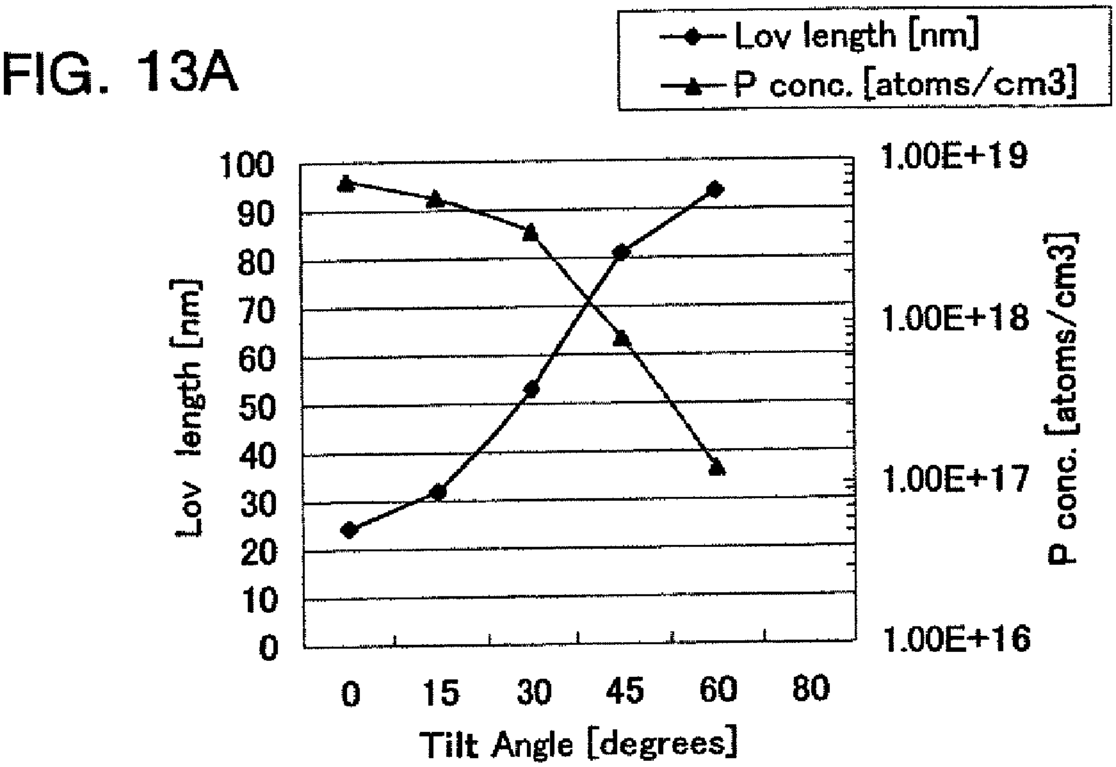
FIGS. 13A and 13B show a relationship between an incidence angle of a dopant, and a width of an Lov region and an impurity concentration.

FIG. 13A shows a result of a relationship between an incident angle (Tilt angle) of a dopant to an island semiconductor film and width of an Lov region in a dopant implantation direction, which is found by simulation. FIG. 13A shows a result of simulation in the case of using P as a dopant. Specifically, it is assumed that a dose amount of P is $3\times10^{15}$ atoms/$cm^2$ and an acceleration voltage is 80 kV. It is also assumed that impurity concentration of an Lov region is equal to or more than ¼ of that of an exposed region without being covered with a gate electrode. In addition, FIG. 13A shows a relationship between an incident angle of a dopant and impurity concentration equivalent to ¼ of that of an exposed region without being covered with a gate electrode (equivalent to impurity concentration of a portion closest to a channel formation region in an Lov region).

As shown in FIG. 13A, width of an Lov region increases, and on the contrary, impurity concentration of a portion closest to a channel formation region in an Lov region decreases, as an incidence angle increases. Even in the case where an incidence angle is 0° in FIG. 13A, that is, the case where a dopant is added in a direction perpendicular to a semiconductor film, an Lov region having a width of approximately 24 nm is formed. However, this is caused by thermal diffusion of a dopant. FIG. 13A shows that an incidence angle is preferably set approximately at least 15° to at most 80°, considering that a hot carrier effect is hard to be suppressed if width of an Lov region is too narrow and impurity concentration of an Lov region is too low.

Figure 13B:
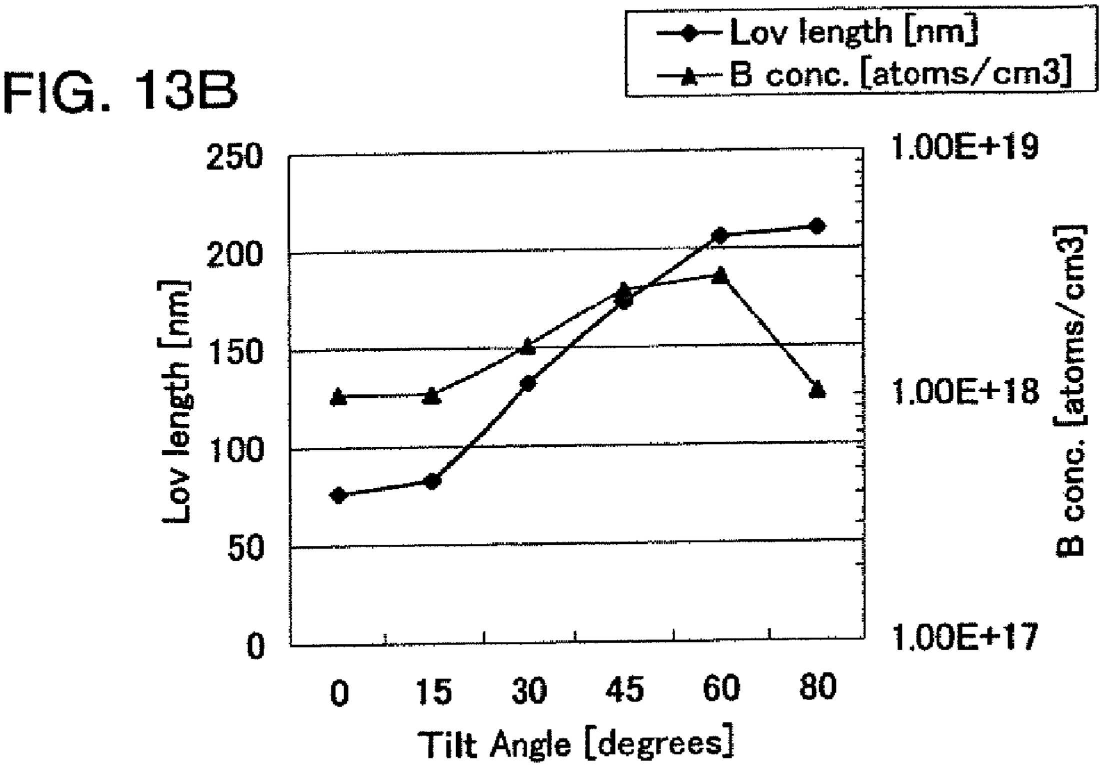

FIG. 13B shows a result of a relationship between an incidence angle of a dopant and width of an Lov region in a dopant implantation direction, which is found by simulation, in the case of using B as a dopant. Specifically, it is assumed that a dose amount of B is $2\times10^{16}$ atoms/$cm^2$ and an acceleration voltage is 80 kV. It is also assumed that impurity concentration of an Lov region is equal to or more than ¼ of that of an exposed region without being covered with a gate electrode. In addition, FIG. 13B shows a relationship between an incidence angle of a dopant and impurity concentration equivalent to ¼ of that of an exposed region without being covered with a gate electrode (equivalent to impurity concentration of a portion closest to a channel formation region in an Lov region).

As shown in FIG. 13B, width of an Lov region increases, and on the contrary, impurity concentration of a portion closest to a channel formation region in an Lov region decreases, as an incidence angle increases. Even in the case where an incidence angle is 0° in FIG. 13B, that is, the case where a dopant is added in a direction perpendicular to a semiconductor film, an Lov region having a width of approximately 76 nm. However, this is caused by thermal diffusion of a dopant. FIG. 13B shows that an incidence angle is preferably set approximately at least 15° to at most 80°, considering that a hot carrier effect is hard to be suppressed if width of an Lov region is too narrow and impurity concentration of an Lov region is too low.

When FIG. 13A and FIG. 13B are compared with each other, it is found that a relationship between an incidence angle, and width of an Lov region and impurity concentration of an Lov region changes depending also on the kind of a dopant. Therefore, it is preferable that a relationship between an incidence angle and width of an Lov region and impurity concentration of an Lov region is grasped, and then an incidence angle of a dopant in ion implantation is determined to a desired width of an Lov region and a desired impurity concentration of an Lov region.

Embodiment 2

Figure 14A:
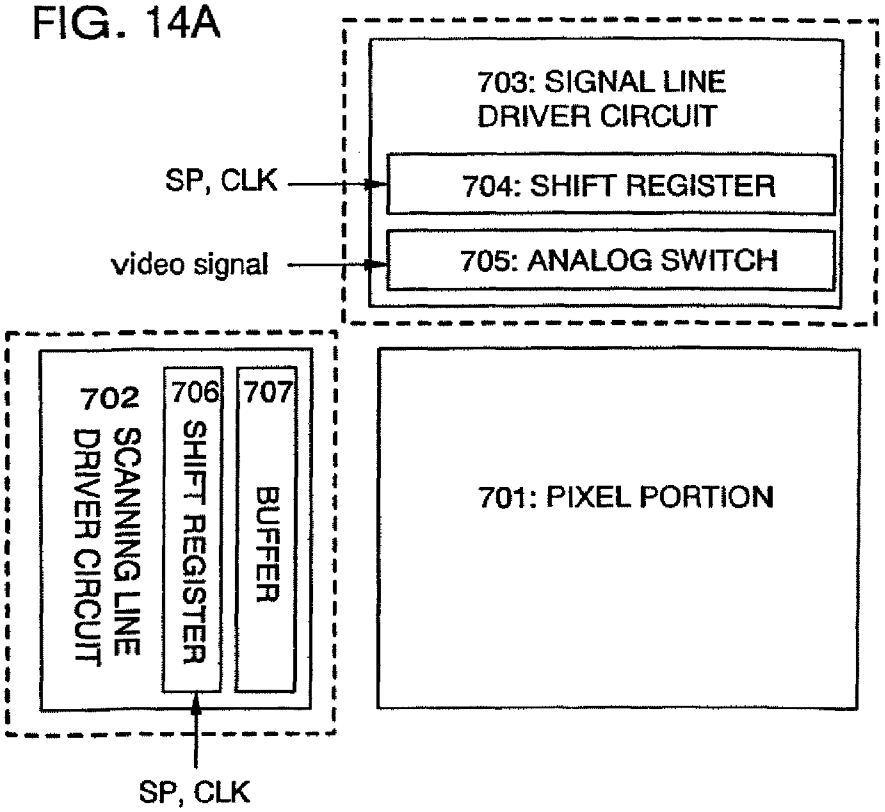
FIGS. 14A and 14B are block diagrams showing a structure of a semiconductor display device.

In this embodiment, one mode of a semiconductor display device of the present invention is described. FIG. 14A is a block diagram of a semiconductor display device of this embodiment. A semiconductor display device shown in FIG. 14A has a pixel portion 701 having a plurality of pixels provided with a display element, a scanning line driver circuit 702 selecting each pixel portion, and a signal line driver circuit 703 controlling input of a video signal into a selected pixel.

In FIG. 14A, the signal line driver circuit 703 includes a shift register 704 and an analog switch 705. A clock signal (CLK) and a start pulse signal (SP) are inputted to the shift register 704. When the clock signal (CLK) and the start pulse signal (SP) are inputted, a timing signal is generated in the shift register 704 and is inputted to the analog switch 705.

In addition, a video signal is inputted to the analog switch 705. The video signal is sampled in the analog switch 705 according to the inputted timing signal and is supplied to a following row of a signal line.

Next, a structure of the scanning line driver circuit 702 is described. The scanning line driver circuit 702 includes a shift register 706 and a buffer 707. In some cases, the scanning line driver circuit 702 may include a level shifter. By input of a clock signal (CLK) and a start pulse signal (SP) into the shift register 706, a selection signal is generated in the scanning line driver circuit 702. The generated selection signal is buffered and amplified by the buffer 707 and is then supplied to a corresponding scanning line. A gate of a transistor for one line of pixels is connected to the scanning line. The transistor for the one line of pixels must simultaneously be put into an ON state. Therefore, the one that is capable of handling a large electric current is used as the buffer 707.

In the semiconductor display device shown in FIG. 14A, the signal line driver circuit 703 and the scanning line driver circuit 702 surrounded by a broken line can be formed in a thin film chip. Note that the present invention is not limited thereto, and one of a scanning line driver circuit and a signal line driver circuit may be formed over a substrate provided with the pixel portion 701 and the other may be formed in a thin film chip. Alternatively, only a part of the signal line driver circuit 703 and a part of the scanning line driver circuit 702 may be formed in a thin film chip.

Figure 14B:
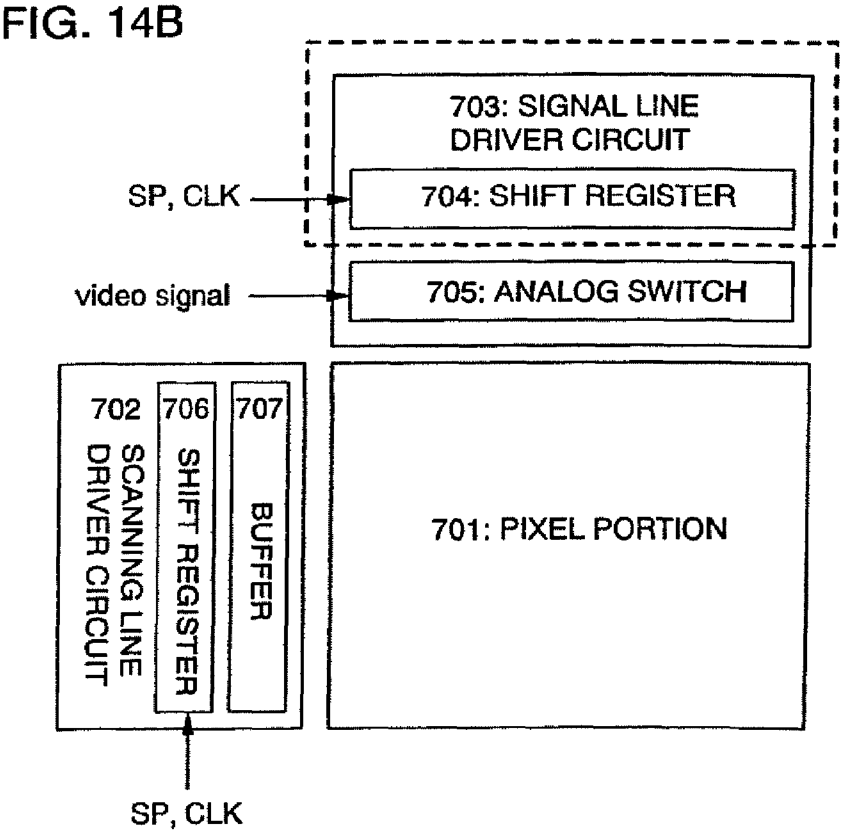

FIG. 14B shows an example that the scanning line driver circuit 702 and the analog switch 705 of the signal line driver circuit 703 are formed over a substrate provided with the pixel portion 701 and the shift register 704 of the signal line driver circuit 703 is formed in a thin film chip. A mode that not only a driver circuit for controlling operation of a display element, typified by a signal line driver circuit or a scanning line driver circuit but also a controller, a CPU, a memory, or the like is formed in a thin film chip and the thin film chip is mounted on a substrate over which a pixel portion is formed may be employed.

Note that the structure shown in FIG. 14A or 14B is merely one mode of a semiconductor display device of the present invention, and a structure of a signal line driver circuit and a scanning line driver circuit is not limited thereto. For example, another circuit capable of selecting a signal line, such as a decoder circuit, may be used in place of the shift registers 704 and 706.

Embodiment 3

Figure 15A:
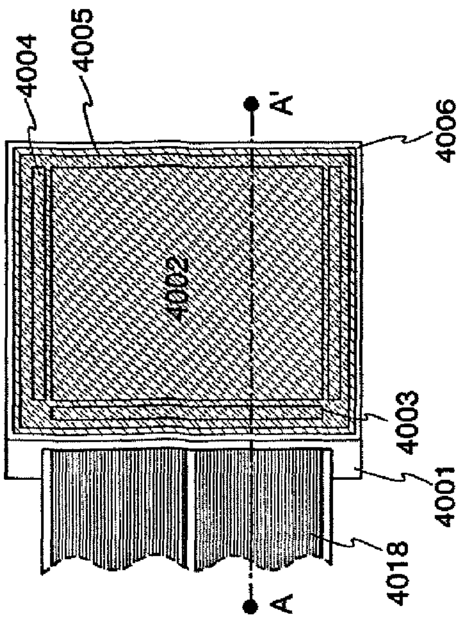
FIGS. 15A and 15B are a top view and a cross-sectional view of a light emitting device corresponding to one mode of a semiconductor device of the present invention.
Figure 15B:
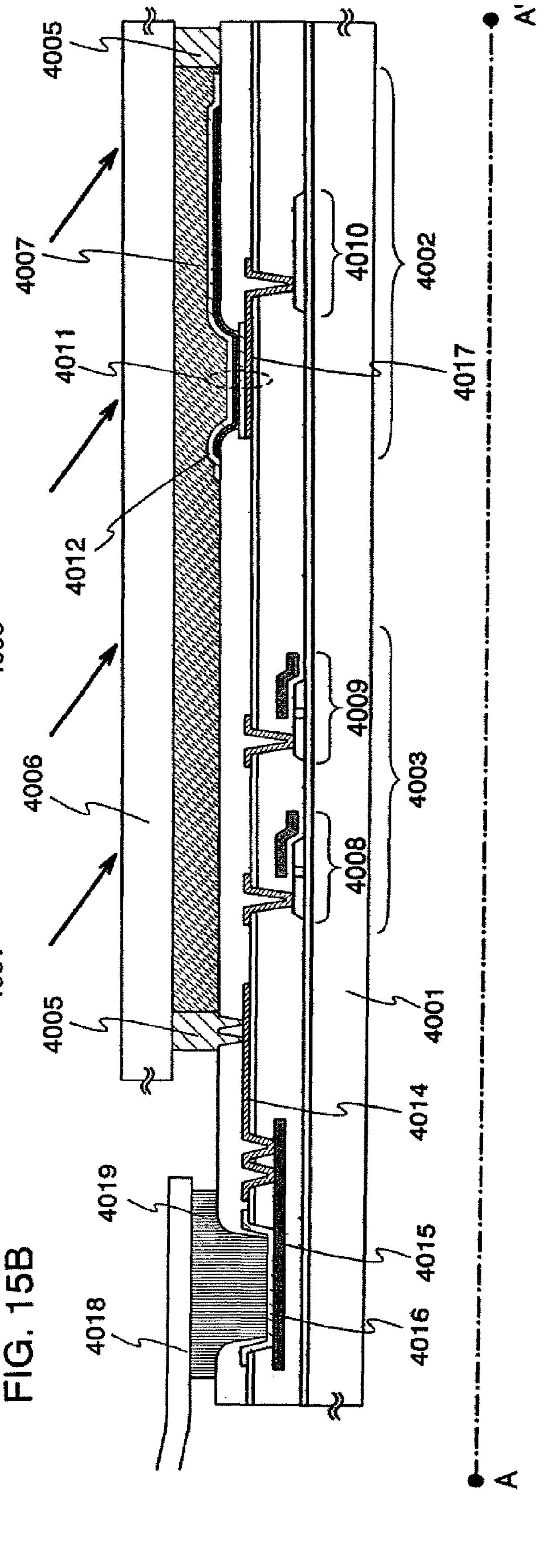

A structure of a light emitting device, which corresponds to one mode of a semiconductor device of the present invention, is described in this embodiment. A light emitting device includes a panel in which a light emitting element is sealed and a module in which an IC including a controller, or the like is mounted on the panel. FIG. 15A is a top view of a panel in which a transistor and a light emitting element formed over a first substrate are sealed with a sealant so as to be sandwiched between the first substrate and a second substrate. FIG. 15B corresponds to a cross-sectional view taken along a line A-A' in FIG. 15A.

A sealant 4005 is provided to surround a pixel portion 4002, a signal line driver circuit 4003, and a scanning line driver circuit 4004 which are provided over a first substrate 4001. A second substrate 4006 is provided over the pixel portion 4002, the signal line driver circuit 4003, and the scanning line driver circuit 4004. Thus, the pixel portion 4002, the signal line driver circuit 4003, and the scanning line driver circuit 4004 are sealed with the first substrate 4006, the sealant 4005, and the second substrate 4001, together with a filler 4007.

The pixel portion 4002, the signal line driver circuit 4003, and the scanning line driver circuit 4004 that are provided over the first substrate 4001 have a plurality of transistors. In FIG. 15B, transistors 4008 and 4009 included in the signal line driver circuit 4003 and a transistor 4010 included in the pixel portion 4002 are exemplified. FIG. 15B corresponds to a cross-sectional view of a panel taken along a dopant implantation direction indicated by arrows. Therefore, it is difficult to illustrate a total image of each transistor along a channel-length direction; accordingly, only partial cross-sectional views of each transistor are shown here. However, the transistors 4008 and 4009 included in the signal line driver circuit 4003 have Lov regions, and the transistor 4010 included in the pixel portion 4002 has an Loff region.

Reference numeral 4011 denotes a light emitting element, and a pixel electrode included in a light emitting element 4011 is electrically connected to a drain of the transistor 4010 through a wiring 4017. In addition, an opposite electrode of the light emitting element 4011 and a transparent conductive film 4012 are electrically connected to each other in this embodiment. Note that a structure of the light emitting element 4011 is not limited to the stricture described in this embodiment. A structure of the light emitting element 4011 can appropriately be changed in response to a direction of light extracted from the light emitting element 4011 and conductivity of the transistor 4010.

Various signals and electric potential supplied to the signal line driver circuit 4003, the scanning line driver circuit 4004, or the pixel portion 4002 are not illustrated in the cross-sectional view shown in FIG. 15B, but are supplied from a connection terminal 4016 through lead wirings 4014 and 4015.

In this embodiment, the connection terminal 4016 is formed of the same conductive film as the pixel electrode included in the light emitting element 4011. The lead wiring 4014 is formed of the same conductive film as the wiring 4017. In addition, the lead wiring 4015 is formed of the same conductive film as gate electrodes included in each of the transistors 4008 to 4010.

The connection terminal 4016 is electrically connected to a terminal included in an FPC 4018 through an anisotropic conductive film 4019.

Glass, metal (typically, stainless steel), ceramics, or plastics can be used for the first substrate 4001 and the second substrate 4006. As plastics, an FRP (fiberglass-reinforced plastics) plate, a PVF (polyvinyl fluoride) film, a Mylar film, a polyester film, or an acrylic resin film may be used. Further, a sheet having a structure in which an aluminum foil is sandwiched between PVF films or Mylar films can also be used.

However, the second substrate needs to be transparent in the case where the second substrate is situated in an extraction direction of light emitted from the light emitting element 4011. In such a case, a light transmitting material such as a glass plate, a plastic plate, a polyester film, or an acrylic film is used.

Further, in addition to an inert gas such as nitrogen or argon, an ultraviolet curable resin or a thermosetting resin may be used as the filler 4007, and PVC (polyvinyl chloride), acrylic, polyimide, an epoxy resin, a silicone resin, PVB (polyvinyl butyral), or EVA (ethylene vinyl acetate) can be used. In this embodiment, nitrogen is used as the filler.

The present invention can be applied not only to the light emitting device described in this embodiment but also to another semiconductor device.

Embodiment 4

Figure 16A:
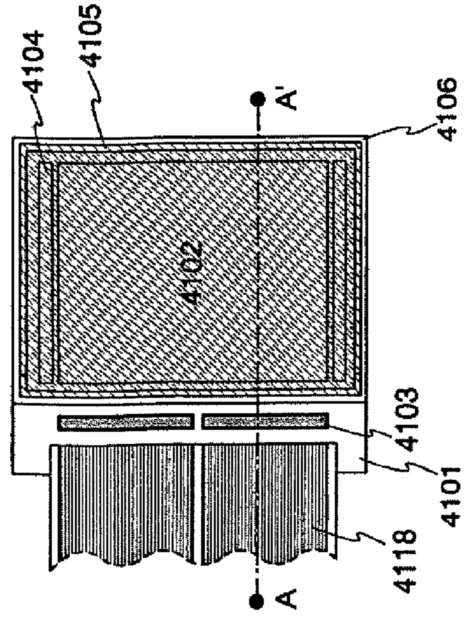
FIGS. 16A and 16B are a top view and a cross-sectional view of a light emitting device corresponding to one mode of a semiconductor device of the present invention.
Figure 16B:
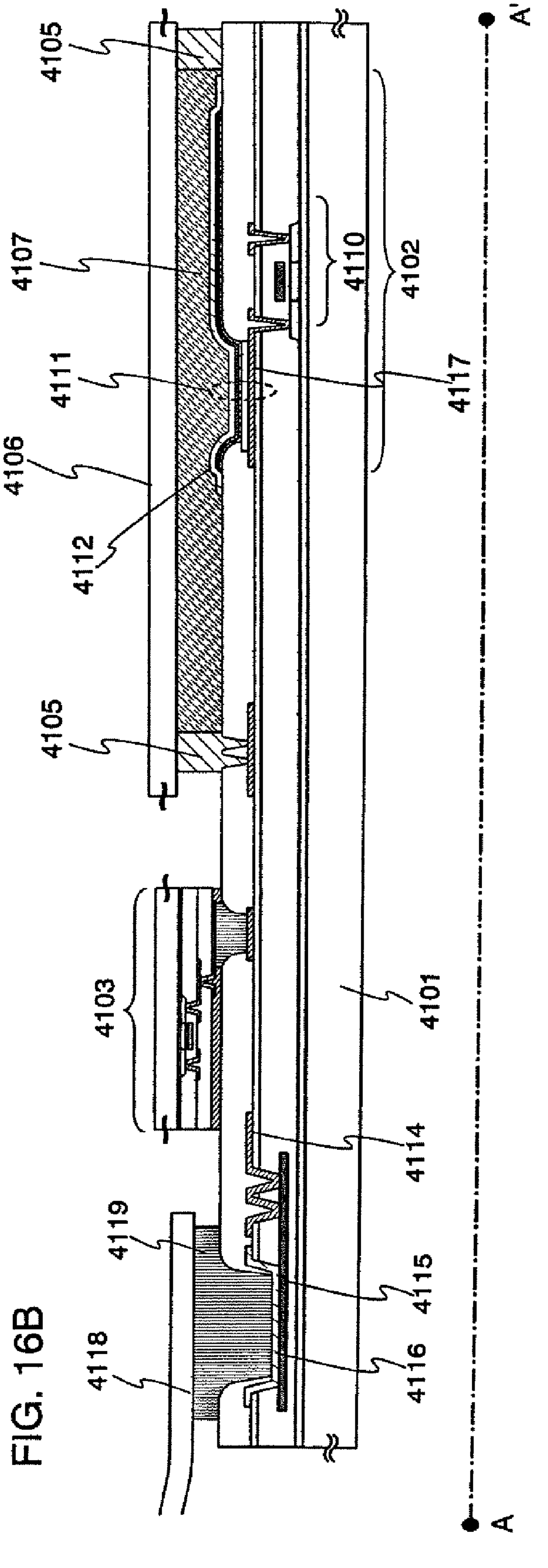

A structure of a light emitting device, which corresponds to one mode of a semiconductor display device of the present invention, is described in this embodiment. A light emitting device includes a panel in which a light emitting element is sealed and a module in which an IC or the like formed of a single crystalline silicon wafer is mounted on the panel. FIG. 16A is a top view of a panel in which a transistor and a light emitting element formed over a first substrate are sealed with a sealant so as to be sandwiched between the first substrate and a second substrate. FIG. 16B corresponds to a cross-sectional view taken along a line A-A' in FIG. 16A.

A sealant 4105 is provided to surround a pixel portion 4102 and a scanning line driver circuit 4104 which are provided over a first substrate 4101. A second substrate 4106 is provided over the pixel portion 4102 and the scanning line driver circuit 4104. Thus, the pixel portion 4102 and the scanning line driver circuit 4104 are sealed with the first substrate 4101, the sealant 4105, and the second substrate 4106, together with a filler 4107. In addition, a signal line driver circuit 4103 formed in a thin film chip is mounted on a region different from a region surrounded by the sealant 4105 over the first substrate 4101.

The pixel portion 4102 and the scanning line driver circuit 4104 that are provided over the first substrate 4101 have a plurality of transistors. In FIG. 16B, only a transistor 4110 included in the pixel portion 4102 is exemplified.

Reference numeral 4111 denotes a light emitting element, and a pixel electrode included in a light emitting element 4111 is electrically connected to a drain of the transistor 4110 through a wiring 4117. In addition, an opposite electrode of the light emitting element 4111 and a transparent conductive film 4112 are electrically connected to each other in this embodiment. Note that a structure of the light emitting element 4111 is not limited to the structure described in this embodiment. A structure of the light emitting element 4111 can appropriately be changed in response to a direction of light extracted from the light emitting element 4111 and conductivity of the transistor 4110.

Various signals and electric potential supplied to the signal line driver circuit 4103 formed in a thin film chip, the scanning line driver circuit 4104, and the pixel portion 4102 are not illustrated in the cross-sectional view shown in FIG. 16B, but are supplied from a connection terminal 4116 through lead wirings 4114 and 4115.

In this embodiment, the connection terminal 4116 is formed of the same conductive film as the pixel electrode included in the light emitting element 4111. In addition, the lead wiring 4114 is formed of the same conductive film as the wiring 4117. Further, the lead wiring 4115 is formed of the same conductive film as a gate electrode included in the transistor 4110.

The connection terminal 4116 is electrically connected to a terminal included in an FPC 4118 through an anisotropic conductive film 4119.

Glass, metal (typically, stainless steel), ceramics, or plastics can be used for the first substrate 4101 and the second substrate 4106. As plastics, an FRP (fiberglass-reinforced plastics) plate, a PVF (polyvinyl fluoride) film, a Mylar film, a polyester film, or an acrylic resin film may be used. Further, a sheet having a structure in which an aluminum foil is sandwiched between PVF films or Mylar films can also be used.

However, the second substrate needs to be transparent in the case where the second substrate is situated in an extraction direction of light emitted from the light emitting element 4111. In such a case, a light transmitting material such as a glass plate, a plastic plate, a polyester film, or an acrylic film is used.

Further, in addition to an inert gas such as nitrogen or argon, an ultraviolet curable resin or a thermosetting resin may be used as the filler 4107, and PVC (polyvinyl chloride), acrylic, polyimide, an epoxy resin, a silicone resin, PVB (polyvinyl butyral), or EVA (ethylene vinyl acetate) can be used. In this embodiment, nitrogen is used as the filler.

FIGS. 16A and 16B show an example that the signal line driver circuit 4103 is formed in a thin film chip and is mounted on the first substrate 4101; however, a circuit which can be formed in a thin film chip is not limited to the signal line driver circuit 4103. A scanning line driver circuit may be formed in a thin film chip, and only a part of a signal line driver circuit or a part of a scanning line driver circuit may be formed in a thin film chip.

The present invention can be applied not only to a light emitting device described in this embodiment but also to another semiconductor device.

Embodiment 5

In this embodiment, an optical system used for irradiation of a continuous wave laser beam is described.

FIGS. 18A to 18D show an optical system of this embodiment mode. An optical system shown in FIG. 18A has two cylindrical lenses 7001 and 7002. A beam spot of a laser beam entering from a direction indicated by an arrow is shaped through the two cylindrical lenses 7001 and 7002, and then the laser beam is radiated to an object to be treated 7003. Note that the cylindrical lens 7002 positioned closer to the object to be treated 7003 has a shorter focal length than that of the cylindrical lens 7001. In order to avoid return light and to perform uniform irradiation, the incidence angle of the laser beam to the object to be treated is set more than 0°, preferably in the range of from 5° to 30°.

Figure 18A:
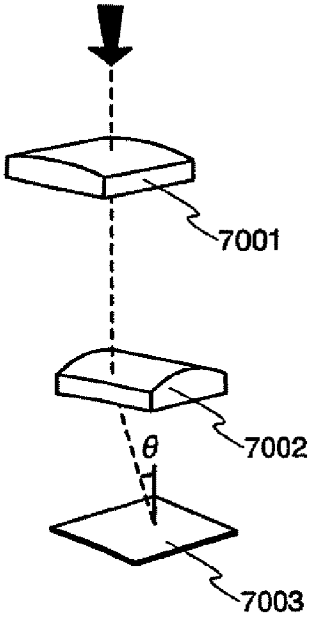
FIGS. 18A to 18D show an optical system used for irradiation of a continuous wave laser beam.
Figure 18B:
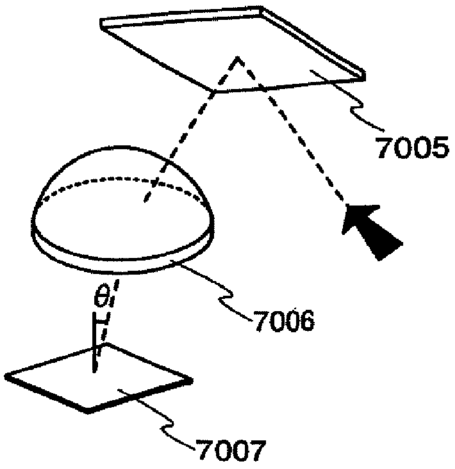

An optical system shown in FIG. 18B has a mirror 7005 and a planoconvex spherical lens 7006. A laser beam entering from a direction indicated by an arrow is reflected from the mirror 7005, and its beam spot is shaped through the planoconvex spherical lens 7006, and then is radiated to an object to be treated 7007. Note that a designer can appropriately determine a radius of curvature of the planoconvex spherical lens. Note that in order to avoid the return light and to perform uniform irradiation, an incidence angle of the laser beam to a substrate is set more than 0°, preferably in the range of from 5° to 30°.

Figure 18C:
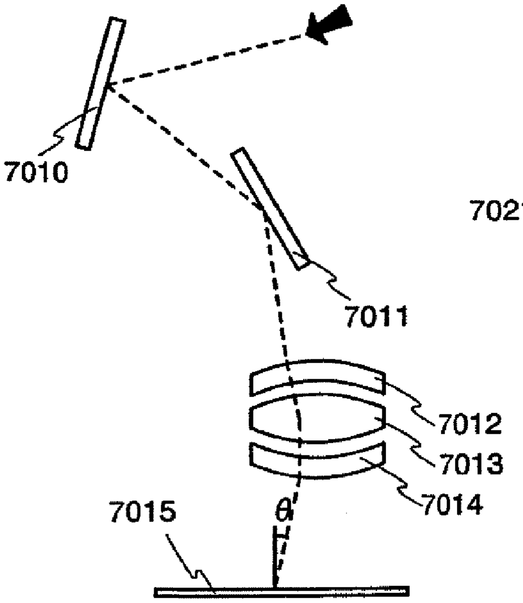

An optical system shown in FIG. 18C has mirrors 7010 and 7011, and lenses 7012, 7013, and 7014. A laser beam entering from a direction indicated by an arrow is reflected from the mirrors 7010 and 7011, and its beam spot is shaped through the lenses 7012, 7013, and 7014, and then is radiated to an object to be treated 7015. In order to avoid the return light and to perform uniform irradiation, an incidence angle of the laser beam to a substrate is set to be more than 0°, preferably in the range of from 5° to 30°.

Figure 18D:
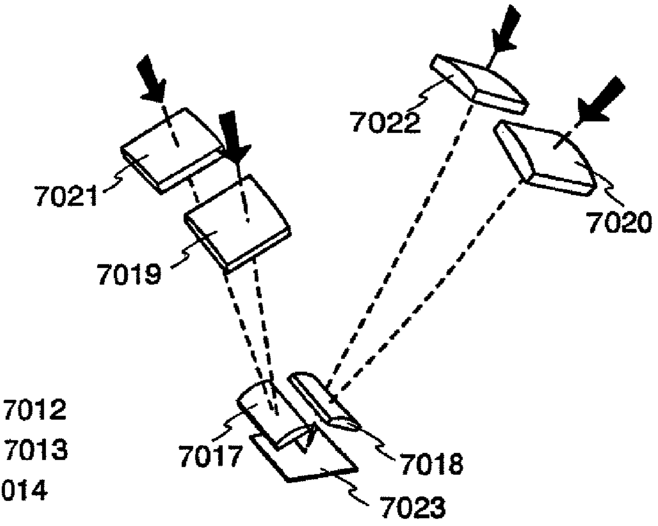

FIG. 18D shows an optical system in the case of combining four beam spots to form one beam spot. The optical system shown in FIG. 18D has six cylindrical lenses 7017 to 7022. Four laser beams from directions indicated by arrows enter the four cylindrical lenses 7019 to 7022, respectively. Beam spots of two laser beams shaped through the cylindrical lenses 7019 and 7021 are again shaped through the cylindrical lens 7017, and then the laser beams are radiated to an object to be treated 7023. On the other hand, beam spots of the other two laser beams shaped through the cylindrical lenses 7020 and 7022 are again shaped through the cylindrical lens 7018, and then the laser beams are radiated to the object to be treated 7023.

Beam spots of each laser beam on the object to be treated 7023 are combined to form one beam spot by partially overlapping each other.

Although it is possible for a designer to appropriately determine the focal length and the incidence angle of each lens, the focal length of the cylindrical lenses 7017 and 7018, which are positioned closest to the object to be treated 7023, are made shorter than that of the cylindrical lenses 7019 to 7022. For example, the focal length of the cylindrical lenses 7017 and 7018, which are positioned closest to the object to be treated 7023, is set 20 mm. The focal length of the cylindrical lenses 7019 to 7022 is set 150 mm. Each lens is disposed so that the incidence angle of the laser beam from the cylindrical lenses 7017 and 7018 to the object to be treated 7023 is 25° and the incidence angle of the laser beam from the cylindrical lenses 7019 to 7022 to the cylindrical lenses 7017 and 7018 is 10° in this embodiment. In order to avoid return light and to perform uniform irradiation, the incidence angle of the laser beam to a substrate is set more than 0°, preferably in the range of from 5° to 30°.

FIG. 18D shows an example of combining four beam spots. In this case, an optical system has four cylindrical lenses corresponding to four laser oscillators and two cylindrical lenses corresponding to the four cylindrical lenses. The number of beam spots to be combined is not limited to this, and the number thereof may be at least 2 to at most 8. When n (n=2, 4, 6, 8) beam spots are combined, an optical system has n cylindrical lenses corresponding to n laser oscillators respectively and n/2 cylindrical lenses corresponding to the n cylindrical lenses. When n (n=3, 5, 7) number of the beam spots are combined, an optical system has the n cylindrical lenses corresponding to the n laser oscillators respectively and (n+1)/2 cylindrical lenses corresponding to the n cylindrical lenses.

When five or more beam spots are overlapped, it is desirable that the fifth and subsequent laser beams are emitted from the side of the rear surface of a substrate in consideration of a position of an optical system, interference, and the like. Moreover, the substrate needs to be translucent.

If either a plane including a shorter side or the one including a longer side when the plane is considered perpendicular to a plane to be irradiated and a shape of each beam spot is considered a rectangle is defined as an incidence plane, it is desirable that an incidence angle θ of the laser beam satisfies the inequality of $\theta \geqq \arctan(W/2d)$. As for the inequality, "W" is a length of the longer side or the shorter side included in the incidence plane and "d" is a thickness of a light-transmitting substrate to the laser beam, which is placed on the plane to be irradiated. When a track of the laser beam is not on the incidence plane, an incidence angle of the track of the laser beam projected to the incidence plane is defined as θ. In the case where the laser beam enters at the incidence angle θ, it is possible to perform uniform irradiation of the laser beam without interference of reflected light from a surface of the substrate with reflected light from a rear surface of the substrate. In the above discussion, a refractive index of the substrate is considered 1. Practically, the substrate often has a refractive index of approximately 1.5. Considering the value, a larger value than an angle calculated in accordance with the above discussion is obtained. However, since energy at both ends in a longitudinal direction of a beam spot is attenuated, the interference has a small influence on both ends and the effect of attenuating the interference can sufficiently be obtained with the above-calculated value.

In addition, an optical system in a laser irradiation apparatus of the present invention is not limited to the structure described in this embodiment.

Embodiment 6

In this embodiment, a shape of a beam spot obtained by combining a plurality of laser beams is described.

Figure 17A:
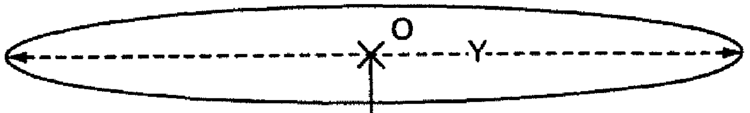

FIG. 17A shows an example of a shape of a beam spot of a laser beam oscillated from each of plural laser oscillators on an object to be treated. A beam spot shown in FIG. 17A has an elliptical shape. Note that a shape of a beam spot of a laser beam oscillated from a laser oscillator is not limited to an ellipse in this embodiment. A shape of a beam spot depends on the kind of a laser, and a shape thereof can be changed through an optical system. For example, a shape of a laser beam emitted from a laser oscillator when using a XeCl excimer laser (wavelength 308 nm, pulse width 30 ns) L3308 manufactured by Lambda Physik Co., Ltd. is a rectangle having a size of 10 mm×30 mm (both are half width in a beam profile). In addition, a shape of an emitted laser beam when using a YAG laser having a cylindrical rod is circular and that of an emitted laser beam when using a YAG laser having a slab rod is rectangular. The laser beam can also be shaped into a laser beam having a desired size by further shaping it through an optical system.

Figure 17B:
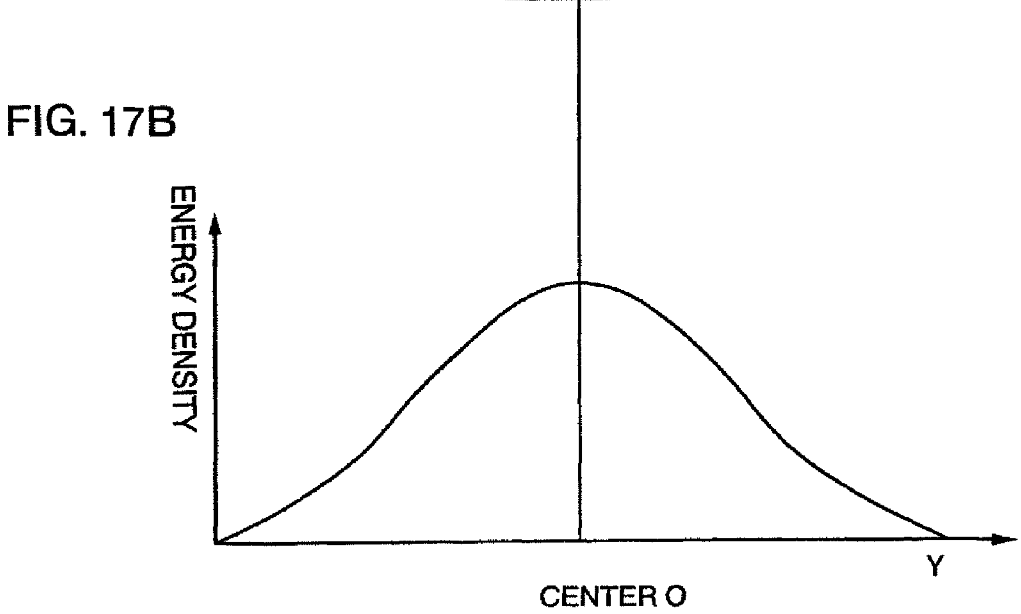

FIG. 17B shows energy density distribution of a laser beam in a Y direction of a major axis of the beam spot shown in FIG. 17A. The beam spot shown in FIG. 17A corresponds to a region satisfying energy density that is $1/e^2$ of a peak value of the energy density in FIG. 17B. Energy density distribution of a laser beam whose beam spot is elliptical becomes higher toward a center O of the ellipse.

Figure 17C:
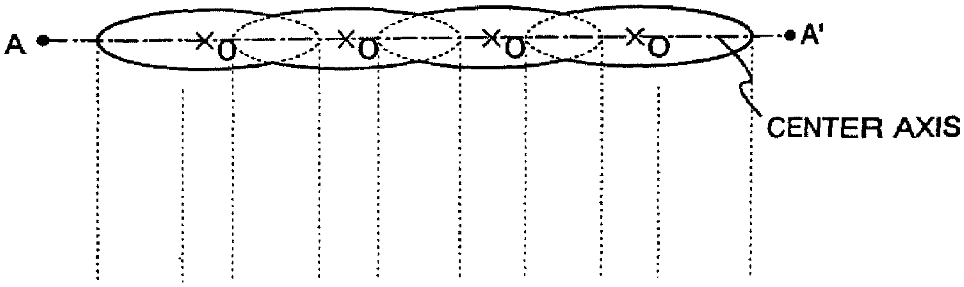
Figure 17C:
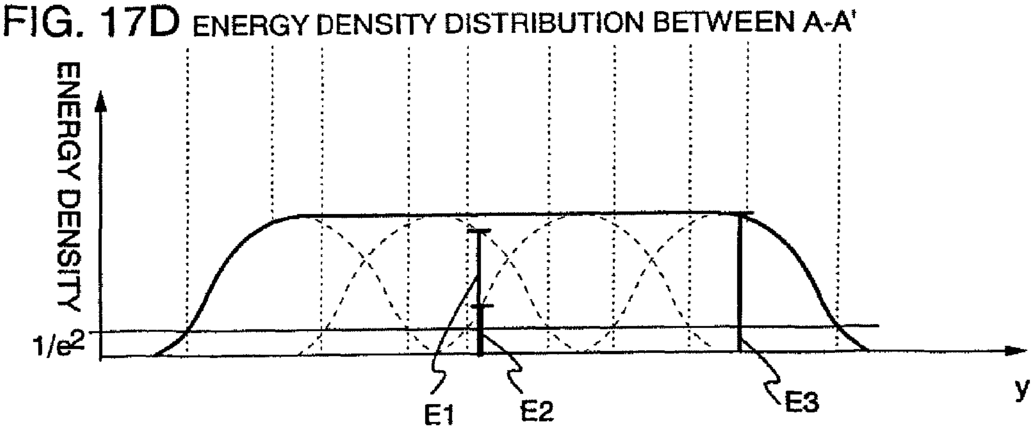

Next, FIG. 17C shows a shape of a beam spot when laser beams having the beam spot shown in FIG. 17A are combined. FIG. 17C shows the case where four beam spots of laser beams are overlapped to form one linear beam spot; however, the number of beam spots to be overlapped is not limited thereto.

As shown in FIG. 17C, beam spots of each laser beam are combined to form one beam spot in such a way that major axes of each ellipse beam matches each other and beam spots are partially overlapped one another. Note that a straight line obtained by connecting centers O of each elliptical beam spot is defined as a central axis of a beam spot.

FIG. 17D shows energy density distribution of laser beams in a Y direction of a central axis of the combined beam spots shown in FIG. 17C. The beam spot shown in FIG. 17C corresponds to a region satisfying energy density that is $1/e^2$ of a peak value of the energy density in FIG. 17B. The energy density is added in a portion in which each beam spot before being combined overlaps. For example, when energy density E1 and energy density E2 of an overlapped beam as shown are added, the added value is almost equal to a peak value E3 of the energy density of the beam. Thus, the energy density is made flat among centers O of each ellipse.

It is ideal that the value added with E1 and E2 becomes equal to E3. However, it is not practically always equal. A designer can appropriately determine a margin of a gap between the value added with E1 and E2 and the value E3.

When a beam spot is singularly employed as shown in FIG. 17A, the beam spot has Gaussian energy distribution. Therefore, it is difficult to irradiate an entire region in which an active layer is formed within a semiconductor film with a laser beam having uniform energy density. However, as FIG. 17D indicates, a region having uniform energy density can be enlarged by employing a plurality of laser beams to be overlapped and to compensate a portion having low energy density each other, compared to singularly employing a plurality of laser beams without overlapping. Accordingly, constraints on a layout of an active layer can be reduced, and crystallinity of a semiconductor film can efficiently be improved.

Embodiment 7

A specific structure of a semiconductor device of the present invention is described with reference to FIG. 19, giving a cellular phone that is one of electronic devices using a semiconductor device as an example.

Figure 19:
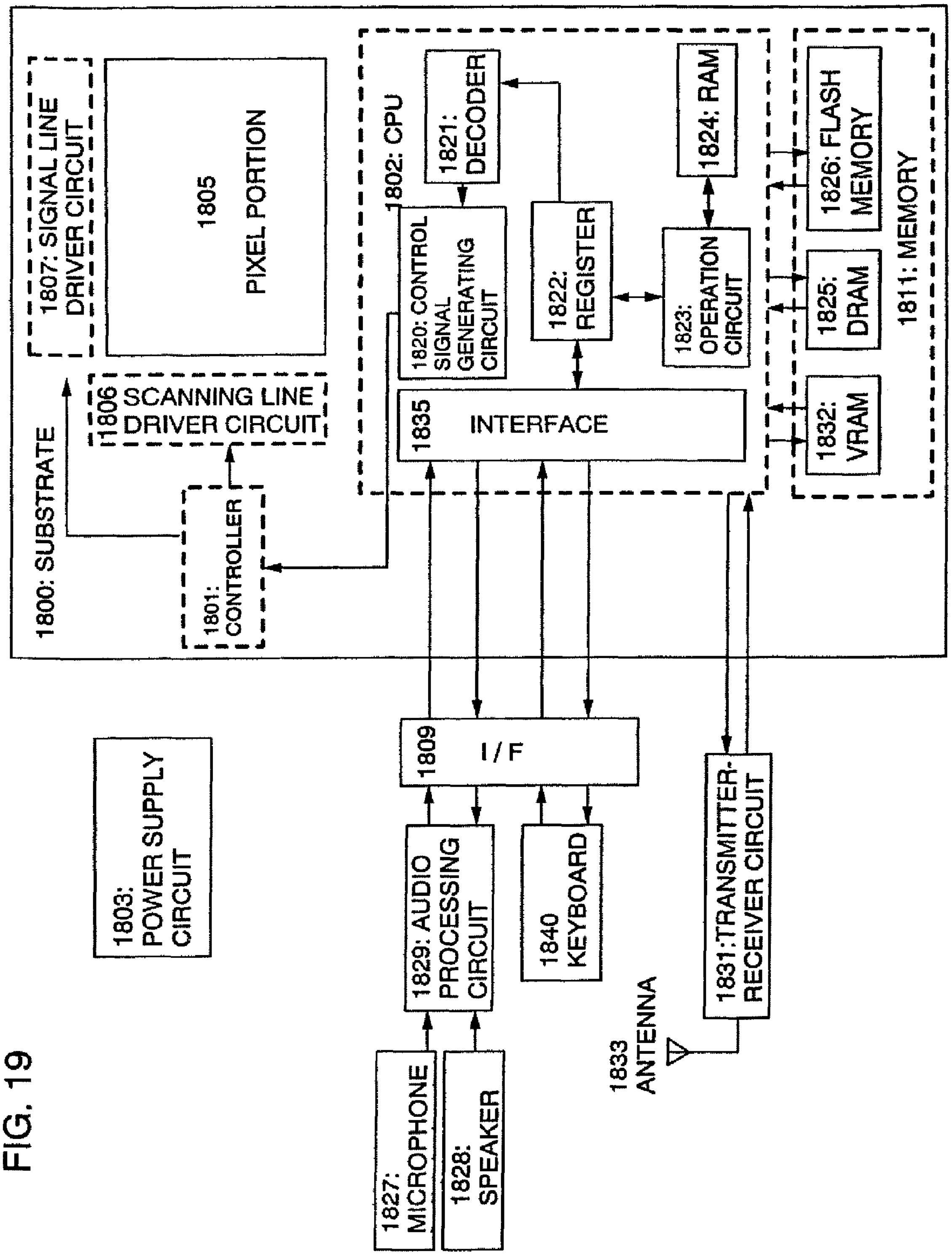
FIG. 19 is a block diagram of a cellular phone which is one of electronic devices.

A cellular phone shown in FIG. 19, a signal line driver circuit 1807, a scanning line driver circuit 1806, a controller 1801, a CPU 1802, and a memory 1811 are mounted on a substrate 1800 over which a pixel portion 1805 is formed as a single thin film chip or a plurality of thin film chips. In addition, a power supply circuit 1803, an audio processing circuit 1829, and a transmitter-receiver circuit 1831 which are provided over a printed wiring board, furthermore, elements such as a resistor element, a buffer element, and a capacitor element are mounted through a connector such as an FPC.

In this embodiment, a VRAM 1832, a DRAM 1825, a flash memory 1826, and the like are included in a memory 1811. Data of an image to be displayed in a panel are stored in the VRAM 1832; image data or audio data are stored in the DRAM 1825; and various kinds of programs are stored in the flash memory.

In the power supply circuit 1803, supply voltage for the signal line driver circuit 1807, the scanning line driver circuit 1806, the controller 1801, the CPU 1802, the audio processing circuit 1829, the memory 1811, and the transmitter-receiver circuit 1804 is generated. In some cases, a power source is provided for the power supply circuit 1803 depending on the panel specification.

The CPU 1802 includes a control signal generating circuit 1820, a decoder 1821, a register 1822, an operation circuit 1823, a RAM 1824, an interface 1835 or the CPU, and the like. Various kinds of signals inputted to the CPU 1802 through the interface 1835 are once stored in the register 1822, and then, are inputted to the operation circuit 1823, the decoder 1821, and the like. In the operation circuit 1823, an operation is performed in accordance with the inputted signal, and a place to which various instructions are sent is designated. On the other hand, the signal inputted to the decoder 1821 is decoded, and is inputted to the control signal generating circuit 1820. A signal including various instructions is generated in the control signal generating circuit 1820 based on the inputted signal, and is sent to the place designated by the operation circuit 1823, specifically, to the memory 1811, the transmitter-receiver circuit 1831, the audio processing circuit 1829, the controller 1801, or the like.

The memory 1811, the transmitter-receiver circuit 1831, the audio processing circuit 1829, and the controller 1801 each operate according to each of received instructions. Each operation is briefly described hereinafter.

A signal inputted from a keyboard 1840 is transmitted to the CPU 1802 through the interface 1809. In the control signal generating circuit 1820, the image data stored in the VRAM 1832 is converted to a predetermined format in accordance with the signal transmitted from a keyboard 1840 and is sent to the controller 1801.

A signal including the image data sent from the CPU 1802 is data-processed in accordance with the panel specification in the controller 1801, and is supplied to the signal line driver circuit 1807 and the scanning line driver Circuit 1806. In addition, a Hsync signal, a Vsync signal, a clock signal CLK, and a volts alternating current (AC Cont) are generated in the controller 1801 in accordance with a supply voltage inputted from the power supply circuit 1803 or various signals inputted from the CPU, and are supplied to the signal line driver circuit 1807 and the scanning line driver circuit 1806.

In the transmitter-receiver circuit 1831, a signal that is transmitted and received as an electric wave is processed in an antenna 1833, and specifically, a high frequency circuit such as an isolator, a band pass filter, a VCO (Voltage Controlled Oscillator), an LPF (Low Pass Filter), a coupler, and a balun is included. A signal including audio information among signals transmitted and received in the transmitter-receiver circuit 1831 is transmitted to the audio processing circuit 1829 by an instruction of the CPU 1802.

A signal including audio information sent by the instruction of the CPU 1802 is demodulated into an audio signal in the audio processing circuit 1829, and is sent to a speaker 1828. An audio signal send from a microphone 1827 is modulated in the audio processing circuit 1829, and is sent to the transmitter-receiver circuit 1831 by the instruction of the CPU 1802.

In this embodiment, the controller 1801, the CPU 1802, and the memory 1811 are formed of thin film chips; however, the present invention is not limited thereto. The power supply circuit 1803 and the audio processing circuit 1829 may be formed of a thin film chip. According to the present invention, anything but a high frequency circuit such as an isolator, a band pass filter, a VCO (Voltage Controlled Oscillator), an LPF (Low Pass Filter), a coupler, or a balun can be formed in a thin film chip and be mounted on a substrate over which a pixel portion is formed.

Embodiment 8

A semiconductor device of the present invention can be used for a display portion of various electronic devices or other circuits for signal processing. Examples of electronic devices using the present invention are as follows: a video camera; a digital camera; a goggle type display (head mounted display); a navigation system; an audio reproducing device (a car audio, an audio component, or the like); a laptop personal computer; a game machine; a personal digital assistant (a mobile computer, a cellular phone, a portable game machine, an electronic book, or the like); an image reproducing device including a recording medium (specifically, a device capable of processing data in a recording medium such as a Digital Versatile Disk (DVD) and having a display that can display the image of the data), and the like. Practical examples of these electronic devices are shown in FIGS. 20A to 20F.

Figure 20A:
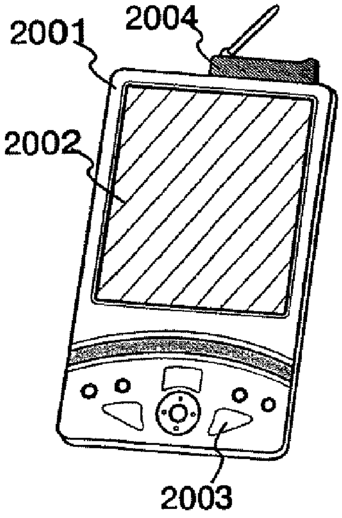
FIGS. 20A to 20F show electronic devices using a semiconductor device of the present invention.

FIG. 20A shows a portable digital assistant, which includes a main body 2001, a display portion 2002, operation keys 2003, a modem 2004, and the like. FIG. 20A shows a personal digital assistant in which the modem 2004 is removable;

however, a modem may be incorporated in the main body 2001. A semiconductor device of the present invention can be used for the display portion 2002 or other circuits for signal processing.

Figure 20B:
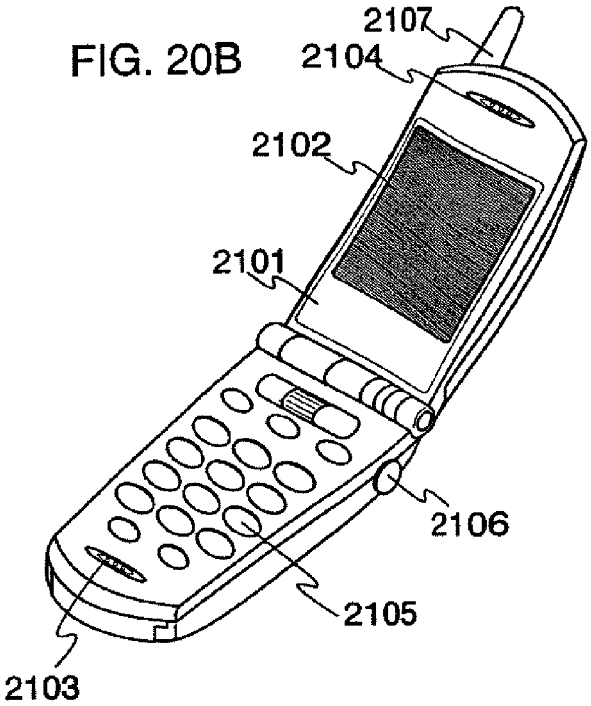

FIG. 20B shows a cellular phone, which includes a main body 2101, a display portion 2102, an audio input portion 2103, an audio output portion 2104, operation keys 2105, an external connection port 2106, an antenna 2107, and the like. If the display portion 2102 displays white letters on black background, a cellular phone consumes less power. A semiconductor device of the present invention can be used for the display portion 2102 or other circuits for signal processing.

Figure 20C:
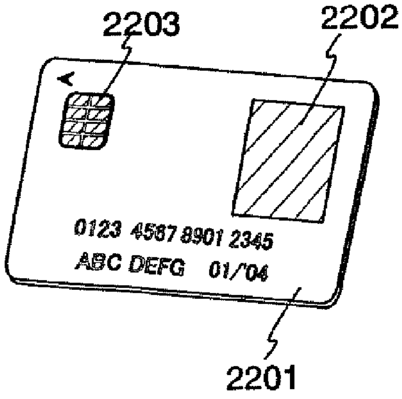

FIG. 20C shows an electronic card, which includes a main body 2201, a display portion 2202, a connection terminal 2203, and the like. A semiconductor device of the present invention can be used for the display portion 2202 or other circuits for signal processing. FIG. 20C shows a contact-type electronic card; however, a semiconductor device of the present invention can be used for an electric card having both functions of a contact-type and a non-contact-type.

Figure 20D:
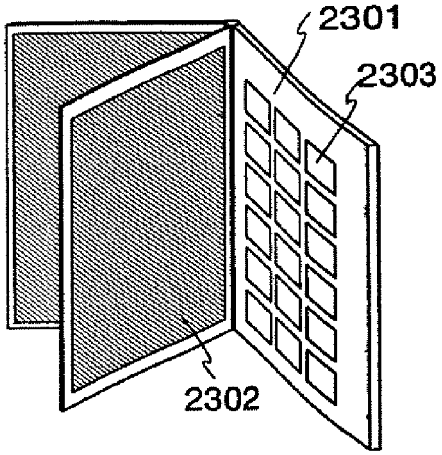

FIG. 20D shows an electronic book, which includes a main body 2301, a display portion 2302, operation keys 2303, and the like. In addition, a modem may be incorporated in the main body 2301. A semiconductor device of the present invention can be used for the display portion 2302 or other circuits for signal processing.

Figure 20E:
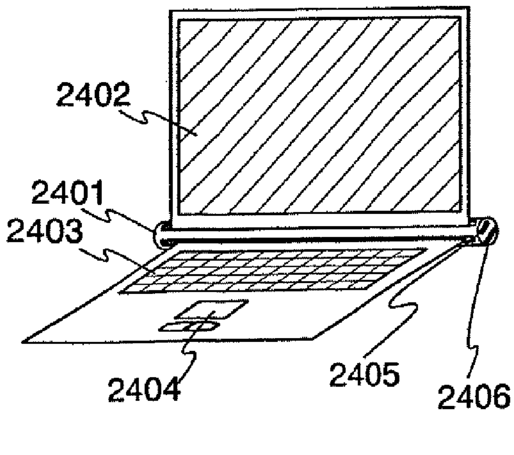

FIG. 20E shows a sheet-shaped personal computer, which includes a main body 2401, a display portion 2402, a keyboard 2403, a touch pad 2404, an external connection port 2405, a plug for power supply 2406, and the like. A semiconductor device of the present invention can be used for the display portion 2402 or other circuits for signal processing.

Figure 20F:
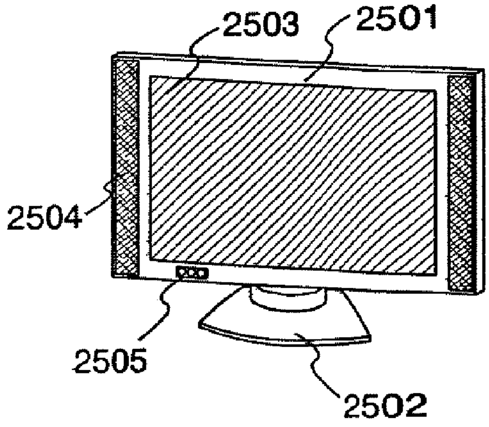

FIG. 20F shows a display device, which includes a chassis 2501, a supporting section 2502, a display portion 2503, a speaker portion 2504, a video input terminal 2505, and the like. A semiconductor device of the present invention can be used for the display portion 2503 or other circuits for signal processing. The display device includes all display devices for displaying information, including ones for personal computers, for TV broadcasting reception, and for advertisement.

As described above, the applicable range of the present invention is so wide that the invention can be applied to electronic devices or other circuits for signal processing of various fields.

This application is based on Japanese Patent Application serial no. 2003-277966 and 2003-277997 both filed in Japan Patent Office on Jul. 23 in 2003, the contents of which are hereby incorporated by reference.

What is claimed is:

1. A method for manufacturing a semiconductor device comprising:

forming a first semiconductor film and a second semiconductor film over a substrate;

forming a first gate electrode over the first semiconductor film and a second gate electrode over the second semiconductor film; and doping an impurity element into a portion of the first semiconductor film and a portion of the second semiconductor film from only one oblique direction with respect to a surface of the substrate to form a first region and a second region in the first semiconductor film, and to form a third region and a fourth region in the second semiconductor film, wherein the second region and the fourth region have a single conductivity type, wherein the first region is overlapped with the first gate electrode, and wherein the third region is in contact with the fourth region.

2. A method for manufacturing a semiconductor device according to claim 1, wherein the first region comprises a channel formation region and an LDD region.

3. A method for manufacturing a semiconductor device according to claim 1, wherein the second region comprises at least one of source region and drain region.

4. A method for manufacturing a semiconductor device according to claim 1, wherein the third region comprises a channel formation region.

5. A method for manufacturing a semiconductor device according to claim 1, wherein the fourth region comprises at least one of source region and drain region.

6. A method for manufacturing a semiconductor device according to claim 1, wherein the semiconductor device is at least one selected from the group consisting of a portable digital assistant, a cellular phone, an electronic card, an electronic book, a personal computer, and a display device.

7. A method for manufacturing a semiconductor device comprising:

forming a first semiconductor film and a second semiconductor film over a substrate;

forming a first gate electrode over the first semiconductor film and a second gate electrode over the second semiconductor film;

doping an impurity element into a portion of the first semiconductor film and a portion of the second semiconductor film from only one oblique direction with respect to a surface of the substrate to form a first region and a second region in the first semiconductor film, and to form a third region and a fourth region in the second semiconductor film, wherein the second region and the fourth region have a single conductivity type, wherein the first region is overlapped with the first gate electrode, and wherein the third region is in contact with the fourth region;

forming a plurality of integrated circuits by using at least the first semiconductor film and the second semiconductor film;

dividing the substrate into a plurality of substrates, wherein at least one of the plurality of substrates has at least one of the plurality of integrated circuits;

mounting the at least one of the plurality of substrates over a third substrate, wherein a semiconductor element or a display element is formed over the third substrate; and electrically connecting the at least one of the plurality of integrated circuits with the semiconductor element or the display element.

8. A method for manufacturing a semiconductor device according to claim 7, wherein the first region comprises a channel formation region and an LDD region.

9. A method for manufacturing a semiconductor device according to claim 7, wherein the second region comprises at least one of source region and drain region.

10. A method for manufacturing a semiconductor device according to claim 7, wherein the third region comprises a channel formation region.

11. A method for manufacturing a semiconductor device according to claim 7, wherein the fourth region comprises at least one of source region and drain region.

12. A method for manufacturing a semiconductor device according to claim 7, wherein the semiconductor device is at least one selected from the group consisting of a portable digital assistant, a cellular phone, an electronic card, an electronic book, a personal computer, and a display device.

* * * * *